US011424399B2

(12) United States Patent
Wang et al.

(10) Patent No.: US 11,424,399 B2
(45) Date of Patent: Aug. 23, 2022

(54) INTEGRATED THERMOELECTRIC DEVICES IN FIN FET TECHNOLOGY

(71) Applicant: TAIWAN SEMICONDUCTOR MANUFACTURING CO., LTD., Hsinchu (TW)

(72) Inventors: Jhong-Sheng Wang, Taichung (TW); Jiaw-Ren Shih, Hsin-Chu (TW); Hsiao-Hsuan Hsu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 268 days.

(21) Appl. No.: 14/793,586

(22) Filed: Jul. 7, 2015

(65) Prior Publication Data
US 2017/0012194 A1    Jan. 12, 2017

(51) Int. Cl.
*H01L 35/00*    (2006.01)
*H01L 35/32*    (2006.01)
(Continued)

(52) U.S. Cl.
CPC .............. *H01L 35/32* (2013.01); *H01L 27/16* (2013.01); *H01L 29/785* (2013.01); *H01L 35/30* (2013.01); *H01L 35/34* (2013.01)

(58) Field of Classification Search
USPC ................................................. 136/200–242
See application file for complete search history.

(56) References Cited

U.S. PATENT DOCUMENTS 6,476,508 B1 * 11/2002 Strnad ................ G05D 23/1919
257/467
7,667,271 B2    2/2010 Yu et al.
(Continued)

FOREIGN PATENT DOCUMENTS

CN         1411058 A      4/2003
CN       104576677 A      4/2015
(Continued)

OTHER PUBLICATIONS

Harald Böttner, Gang Chen and Rama Venkatasubramanian, "Aspects of thin-film superlattice thermoelectric materials, devices, and applications," MRS Bulletin, vol. 31, Issue 03, Mar. 2006, pp. 211-217.
(Continued)

*Primary Examiner* — Thanh Trug Trinh
(74) *Attorney, Agent, or Firm* — McDermott Will & Emery LLP

(57) ABSTRACT

Operations for integrating thermoelectric devices in Fin FET technology may be implemented in a semiconductor device having a thermoelectric device. The thermoelectric device includes a substrate and a fin structure disposed on the substrate. The thermoelectric device includes a first connecting layer and a second connecting layer disposed on opposing ends of the fin structure. The thermoelectric device includes a first thermal conductive structure thermally and a second thermal conductive structure thermally coupled to the opposing ends of the fin structure. The fin structure may be configured to transfer heat from one of the first thermal conductive structure or the second thermal conductive structure to the other thermal conductive structure based on a direction of current flow through the fin structure. In this regard, the current flow may be adjusted by a power circuit electrically coupled to the thermoelectric device.

20 Claims, 8 Drawing Sheets

(51) Int. Cl.
*H01L 35/34* (2006.01)
*H01L 35/30* (2006.01)
*H01L 27/16* (2006.01)
*H01L 29/78* (2006.01)

(56) References Cited

U.S. PATENT DOCUMENTS

| | | |
|---|---|---|
| 7,910,453 B2 | 3/2011 | Xu et al. |
| 8,377,779 B1 | 2/2013 | Wang |
| 8,399,931 B2 | 3/2013 | Liaw et al. |
| 8,487,378 B2 | 7/2013 | Goto et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,826,213 B1 | 9/2014 | Ho et al. |
| 8,860,148 B2 | 10/2014 | Hu et al. |
| 8,887,106 B2 | 11/2014 | Ho et al. |
| 2003/0057511 A1* | 3/2003 | Inbe .............. H01L 23/38 257/467 |
| 2004/0000333 A1* | 1/2004 | Chen .............. H01L 23/38 136/224 |
| 2006/0102223 A1* | 5/2006 | Chen .............. H01L 23/38 136/201 |
| 2008/0124893 A1* | 5/2008 | Kim ................ H01L 21/3081 438/426 |
| 2009/0126771 A1* | 5/2009 | Takahashi ......... H01L 35/06 136/203 |
| 2013/0015549 A1* | 1/2013 | Fornara ........... H01L 27/16 257/467 |
| 2014/0001574 A1 | 1/2014 | Chen et al. |
| 2014/0110755 A1 | 4/2014 | Colinge |
| 2014/0151812 A1 | 6/2014 | Liaw |
| 2014/0246066 A1* | 9/2014 | Chen .............. H01L 35/34 136/212 |
| 2014/0282326 A1 | 9/2014 | Chen et al. |

FOREIGN PATENT DOCUMENTS

| | | |
|---|---|---|
| JP | 06-275871 A | 9/1994 |
| JP | 2007-042895 A | 2/2007 |
| JP | 2009-182226 A | 8/2009 |
| KR | 10-2009-0020236 A | 2/2009 |

OTHER PUBLICATIONS

Y. Wang et al., "Thermoelectric Generator Module with Convective Heat Transfer", Aug. 14, 2014, 2 pgs.

A. J. Minnich et al., "Bulk nanostructured thermoelectric materials: current research and future prospects," Energy & Environmental Science, Feb. 27, 2009, 2, pp. 466-479.

Ethem Erkan Aktakka et al. "Post-CMOS FinFET Integration of Bismuth Telluride and Antimony Telluride Thin-Film-Based Thermoelectric Devices on Sol Substrate," IEEE Electron Device Letters, vol. 34, No. 10, Sep. 5, 2013, pp. 1334-1336.

Akram I. Boukai# et al.,"Silicon Nanowires as Highly Efficient Thermoelectric Materials—Supplemenetary Information (Experiment)," Nature 451, pp. 1-20, Jan. 10, 2008.

G. Jeffrey Snyder et al., "Complex Thermoelectric Materials," Nature Materials, vol. 7, pp. 105-114, Feb. 2008.

http://www.thermoelecliics.caltech.edu/thermoelectrics/engineering.html.

http://www.eng.utah.edu/~sparks/how-do-thermoelectrics-work.html.

H. Bottner et al., "Aspects of Thin-Film Superlattice Thermoelectric Materials, Devices, and Applications", MRS Bulletin, vol. 31, Mar. 2006, pp. 211-217.

Notice of Allowance issued in corresponding Korean Patent Application No. 10-2015-0162354, dated Oct. 26, 2017, with partial translation.

Chinese Office Action issued in corresponding Chinese Patent Application No. 201610010247.0, dated Jun. 4, 2018.

* cited by examiner

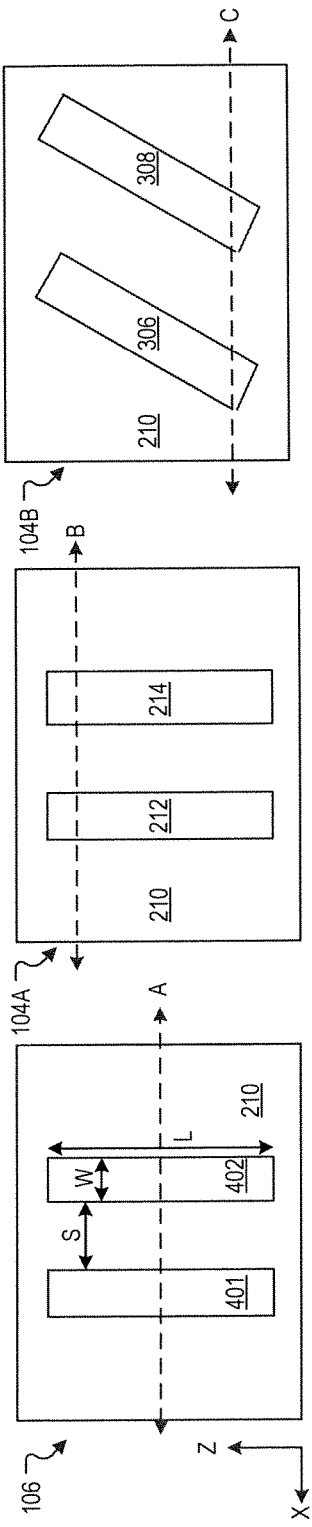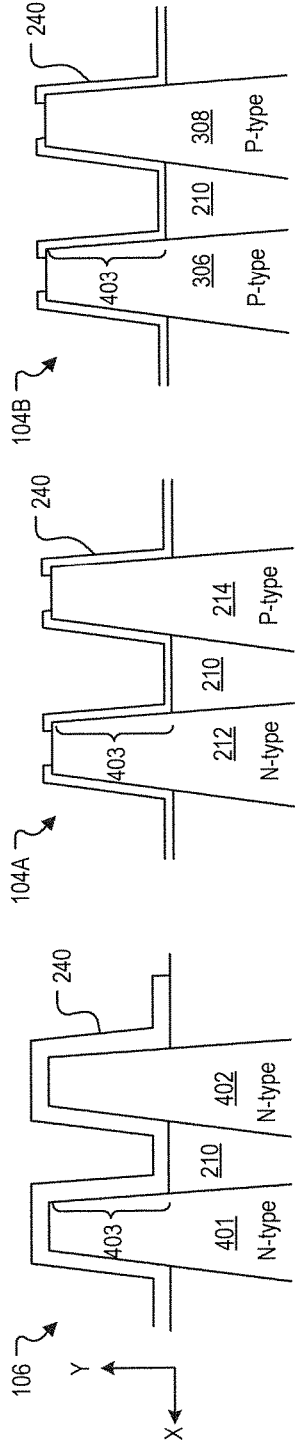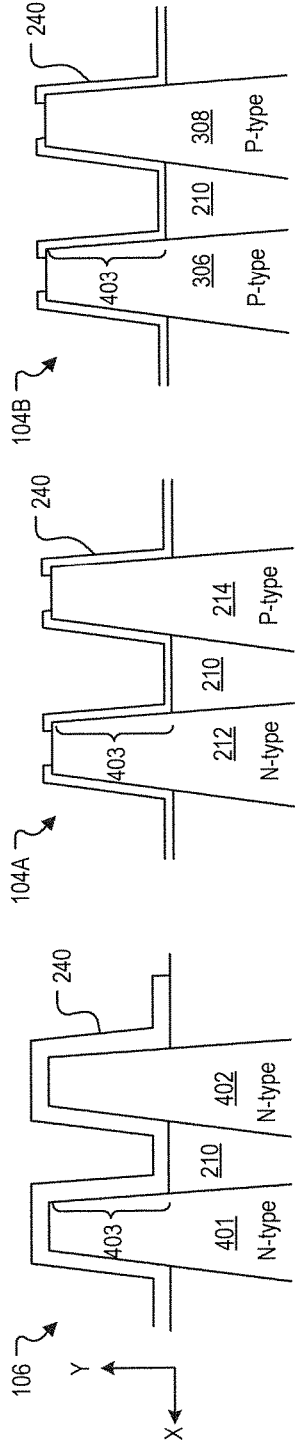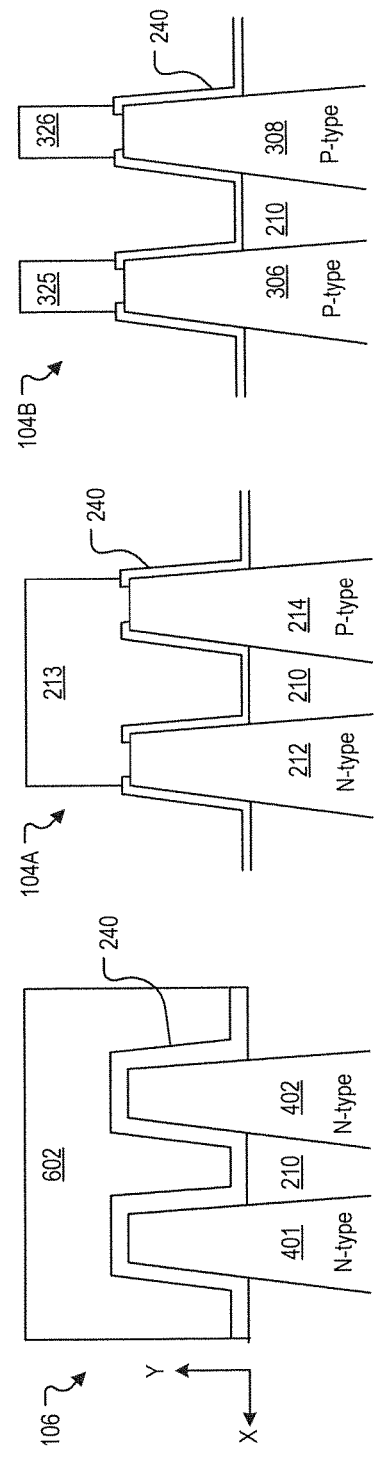

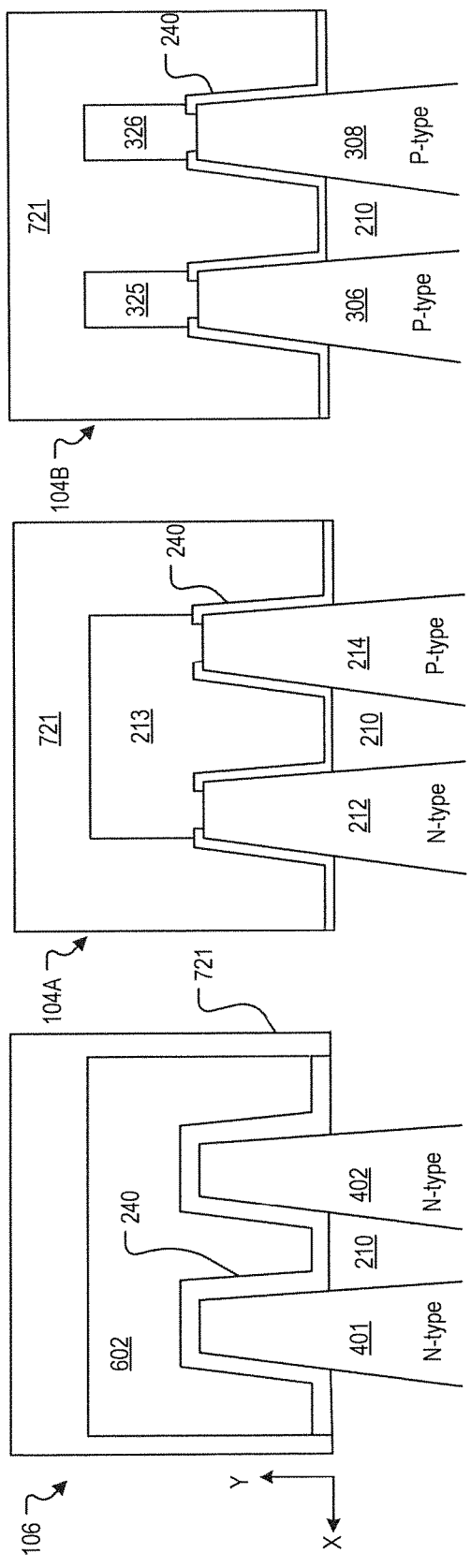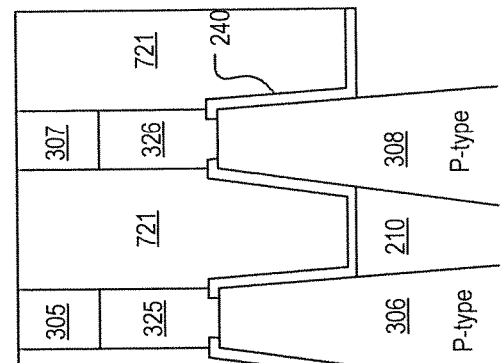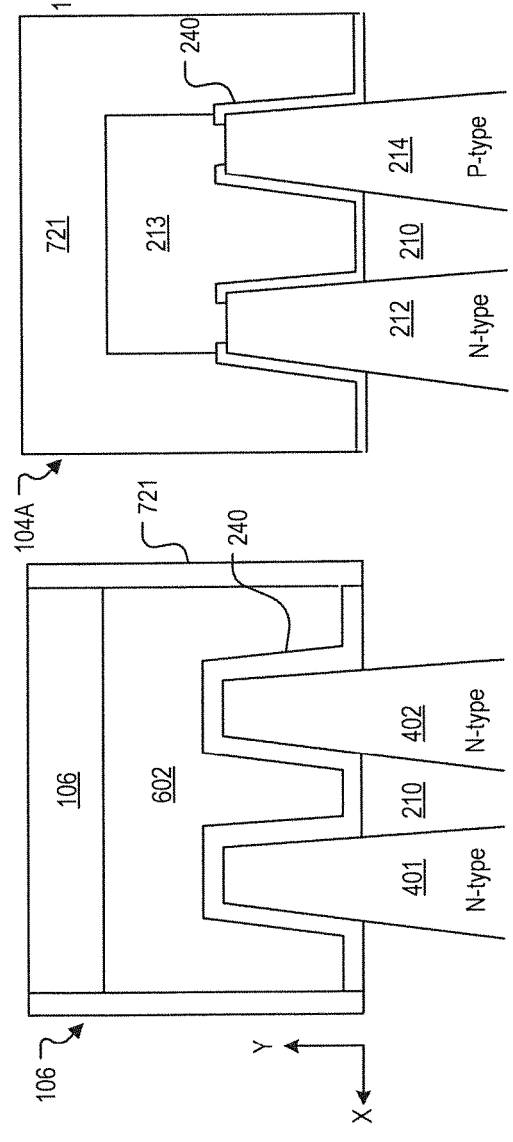

ic system in a second configuration in accordance with
some embodiments of the present disclosure.

INTEGRATED THERMOELECTRIC DEVICES IN FIN FET TECHNOLOGY

TECHNICAL FIELD

The disclosure generally relates to a semiconductor integrated circuit, more particularly to a semiconductor device having an integrated thermoelectric device in fin field effect transistor technology and its manufacturing process.

BACKGROUND

Traditional thermoelectric devices are discrete elements by connecting n- and p-type semiconductor structures to form a main carrier path. Since charge carriers diffuse from hot to cold sides to create a transfer of heat, a corresponding thermoelectric effect may generate additional power (power generation) or cool down (refrigeration) the system temperature.

As the semiconductor industry has progressed into nanometer technology process nodes in pursuit of higher device density, higher performance, and lower costs, challenges in both fabrication and design issues arise in the development of thermoelectric devices for semiconductor technologies.

BRIEF DESCRIPTION OF THE DRAWINGS

Aspects of the present disclosure are best understood from the following detailed description when read with the accompanying figures. It is to be understood that the following disclosure provides many different embodiments, or examples, for implementing different features of the present disclosure. Specific examples of components and arrangements are described below to simplify the present disclosure. These are, of course, merely examples and are not intended to be limiting. It is noted that, in accordance with the standard practice in the industry, various features are not drawn to scale. In fact, the dimensions of the various features may be arbitrarily increased or reduced for clarity of discussion.

FIGS. 4A-8C illustrate examples of cross-sectional views of intermediate stages of a sequential process in the fabrication of an operating circuit and thermoelectric device using Fin FET technology in accordance with some embodiments of the present disclosure.

DETAILED DESCRIPTION

Figure 1B:
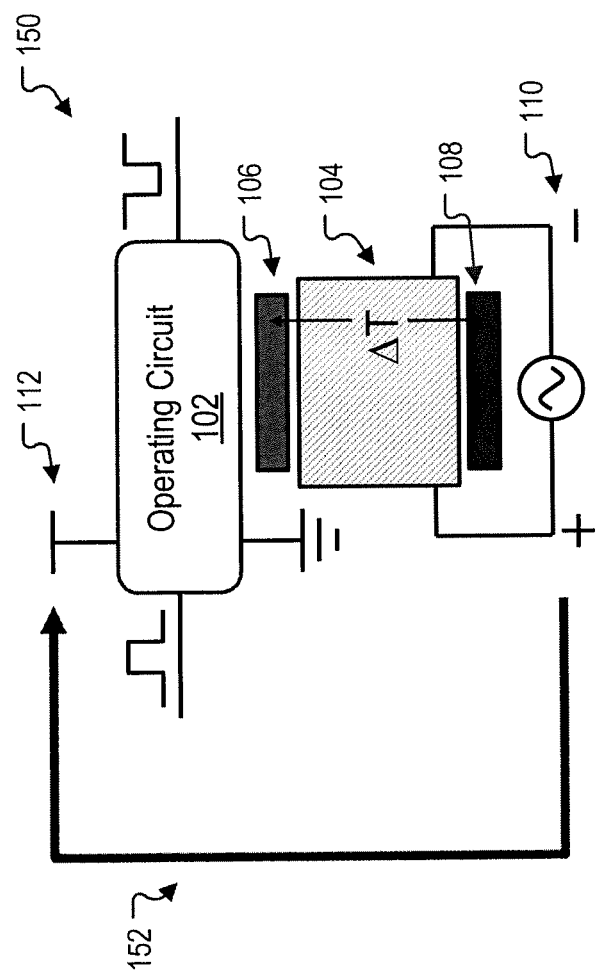
FIGS. 1A-1B illustrate schematic diagrams of examples of thermoelectric systems in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

In FIGS. 2A-8C shown below, an X-Y axis and an X-Z axis are provided to describe the multi-dimensional view of the corresponding figure. The X-Y axis represents a two-dimensional view of a horizontal plane orthogonal to a vertical plane, where X represents the horizontal plane and Y represents the vertical plane. In addition, the X-Z axis represents a two-dimensional view of a first horizontal plane orthogonal to a second horizontal plane, where X represents the first horizontal plane and Z represents the second horizontal plane.

Figure 1A:
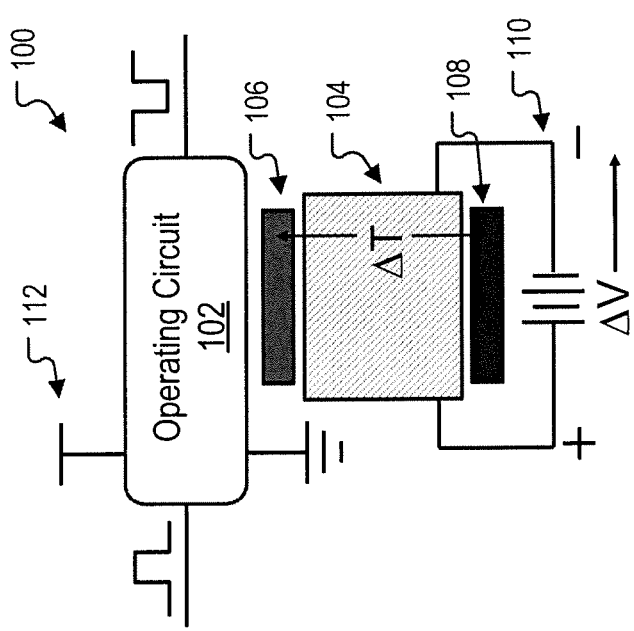

FIGS. 1A-1B illustrate schematic diagrams of examples of thermoelectric systems.

Not all of the depicted components may be required, however, and one or more implementations may include additional components not shown in the figure. Variations in the arrangement and type of the components may be made without departing from the scope of the claims as set forth herein. Additional components, different components, or fewer components may be provided.

In FIG. 1A, a thermoelectric system 100 of a first type (e.g., refrigeration mode) includes an operating circuit 102 (heat source), a thermoelectric device 104 (e.g., Peltier device), a thermal conductive structure 106, a thermal conductive structure 108 and a first power circuit 110. The operating circuit 102 is electrically coupled to a second power circuit 112, supplying power to active circuits in the operating circuit 102.

The thermoelectric device 104 may be configured to provide a thermoelectric effect in the refrigeration mode. The thermoelectric device 104 is configured to transfer heat from the thermal conductive structure 106 to the thermal conductive structure 108 such that the temperature at the thermal conductive structure 106 is reduced by $\Delta T$ while generating a voltage potential $\Delta V$ observed between the positive pole and the negative pole of the first power circuit 110.

Heat is absorbed from the operating circuit 102 disposed near the thermal conductive structure 106. The hot side of the metal (e.g., thermal conductive structure 106) has a higher concentration of electrons than the cold side (e.g., the thermal conductive structure 108). Diffusion of electrons from a hot side to a cold side occurs because electrons move to where energy is lower. As such, heat is transferred in the direction of charge carrier movement throughout the thermoelectric device 104 since charge carriers dictate the direction of heat flow.

In FIG. 1B, a thermoelectric system 150 may provide a thermoelectric effect in a power generation mode. The thermoelectric system 150 includes the operating circuit 102, the thermoelectric device 104, the thermal conductive structure 106, the thermal conductive structure 108 and the first power circuit 110. The operating circuit 102 is electrically coupled to the second power circuit 112, supplying power to active circuits in the operating circuit 102.

In addition, the thermoelectric system 150 may include a power transmission line 152 (e.g., a conductive trace or routing line) that is fed back from the first power circuit 110 to the second power circuit 112. The first power circuit 110 is configured to operate as a load such that the transferred heat through the thermoelectric device 104 is translated into corresponding power to be recycled back to the second power circuit 112 via the power transmission line 152.

The fabrication of traditional thermoelectric devices using discrete elements faces increasing challenges as the development of thermoelectric devices moves toward higher device density. Bulk nanostructured thermoelectric materials are traditionally discrete components that are relatively large in size and require additional cost to produce. In many cases, these materials yield components having a relatively long distance to the heat source, rendering these materials incompatible with nanometer technology process nodes.

In some approaches, thermoelectric devices implement an intrinsic fin field effect transistor (Fin FET) self-heating effect, which causes relatively higher circuit temperature and induces reliability degradation. This additional heat becomes increasingly impractical and cannot provide a desirable benefit for thermoelectric products.

In other approaches, heterogeneous integration of bismuth telluride ($Bi_2Te_3$) and antimony telluride ($Sb_2Te_3$) thin-film-based thermoelectric devices can be performed on a CMOS substrate. For example, these thermoelectric films are deposited on a silicon-on-insulator substrate with Fin FETs (three-dimensional multiple gate field effect transistors) via a characterized thermoelectric-film co-evaporation and shadow-mask patterning process using pre-deposition surface treatment methods for reduced thermoelectric-metal contact resistance. Another approach uses silicon nanowire as thermoelectric devices. However, these approaches require additional process steps in fabrication.

In yet other approaches, different material designs can be used to yield a low thermal conductivity material. For example, thin-film super-lattice thermoelectric materials can be used for thermoelectric devices. However, such materials are not readily suitable for integration into CMOS including nanometer-scale circuits, and require a relatively high cost to produce.

In still other approaches, super-lattice structures traditionally have strong boundary scattering and can produce low thermal conductivity devices. However, these materials require a special method to form the super-lattice structure that cannot be realized in CMOS and also requires a relatively high cost to produce.

The present disclosure provides for the thermoelectric effect to recycle energy or cool down a circuit or system temperature by embedded thermoelectric devices in Fin FET integrated circuits. A fin structure in Fin FET technology, which owns relatively high electrical conductance but relatively low thermal conductance, exhibits desirable properties for thermoelectric devices.

Integrating the thermoelectric device in Fin FET technology provides several advantages over the traditional thermoelectric devices, such as (1) the device would require substantially no or minimum additional fabrication efforts to realize the fin structure as a thermoelectric device in Fin FET technology, (2) the device can be directly integrated with CMOS processes, (3) the device has a relatively small footprint suitable for small chip applications, (4) the device requires a low cost to produce due to the relatively small footprint, (5) thermoelectric properties of the fin structure facilitate in reducing the self-heating effects, and (6) the device can provide more electrical conductance than the traditional thermoelectric devices.

Since the Fin FET based thermoelectric devices can be located proximate to an active circuit (or heat source) compared to common discrete elements, the efficiency of the thermoelectric effect can be significantly higher than the traditional thermoelectric devices. For example, a Fin FET based thermoelectric device can compensate for the Fin FET self-heating issues by having the thermoelectric element placed adjacent to an operating circuit to cool down the device temperature, or use the wasted heat from the self-heating effect or from operating circuit heat to recycle the power.

Figure 2A:
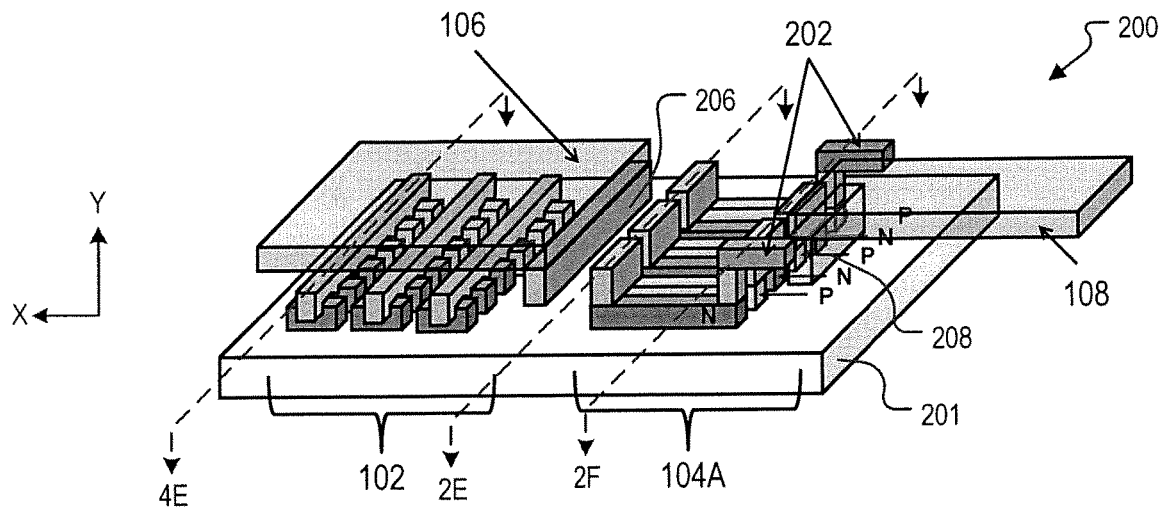
FIG. 2A is a perspective view of an exemplary thermoelectric system in a first configuration in accordance with some embodiments of the present disclosure.

FIG. 2A is a perspective view of an exemplary thermoelectric system 200 in a first configuration in accordance with some embodiments of the present disclosure. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

The thermoelectric system 200 includes a substrate 201 having the operating circuit 102 disposed on the substrate 201 and the thermoelectric device 104A disposed on the substrate 201. The thermoelectric device 104A may be disposed near the operating circuit 102. The thermoelectric system 200 includes the thermal conductive structure 106 and the thermal conductive structure 108 to facilitate the heat transfer from the operating circuit 102 through the thermoelectric device 104A. The thermoelectric system 200 also includes power interconnect structures 202 which electrically couple to a voltage source (e.g., the first power circuit 110)

In one or more implementations, the thermoelectric device 104A contains n- and p-type semiconductor structures disposed between the thermal conductive structure 106 (acting as an active cooling element) and the thermal conductive structure 108 (acting as a heat sink element) to form a charged carrier path between the active cooling element and the heat sink element. The thermoelectric device 104A is configured to transfer heat between opposing thermal conductive structures 106 and 108 via series-connected fin structures based on a direction of current flow through the series-connected fin structures. The thermoelectric system 200 also includes one or more power circuits electrically coupled to the thermoelectric device 104A. The one or more power circuits may be configured to adjust the current flow for energy recycle or power generation in the thermoelectric device 104A.

The series-connected fin structures may be daisy-chained with the connecting layers arranged orthogonal to each of the fin structures. In one or more implementations, the thermoelectric system 200 includes a first support structure 206 coupled to the thermal conductive structure 106, and a second support structure 208 coupled to the thermal conductive structure 108. In this embodiment, the thermal conductive structure 106 is arranged directly above the operating circuit 102 such that the thermal conductive structure 106 is overlapping at least a portion of the operating circuit 102 to effectively absorb heat generated by the operating circuit 102. The thermal conductive structure 108 is arranged above a plane of the thermoelectric device 104A, and the thermal conductive structure 108 is non-overlapping the thermoelectric device 104A. In this regard, the placement of the thermal conductive structure 108 allows the absorbed heat from the thermal conductive structure 106 to be released into an open area (or air gap) formed beneath the thermal conductive structure 108. In some aspects, the thermal conductive structure 108 is surrounded by one or more isolation materials. In one or more implementations, the first support structure 206 and second support structure 208 each includes a conductive material (or a metal).

In this embodiment, the substrate 201 includes a crystalline silicon substrate (e.g., wafer). Alternatively, the substrate 201 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof.

In some embodiments, the substrate 201 is a silicon single layer or multilayer structure of an SOI (silicon-on insulator) substrate. When an SOI substrate is used, the semiconductor structure may protrude from the silicon layer of the SOI substrate or may protrude from the insulator layer of the SOI substrate. In the latter case, the silicon layer of the SOI substrate is used to form the semiconductor structure. Amorphous substrates, such as amorphous Si or amorphous SiC, or insulating material, such as silicon oxide may also be used as the substrate 201.

Also alternatively, the substrate 201 may include an epitaxial layer. For example, the substrate 201 may have an epitaxial layer overlying a bulk semiconductor. Further, the substrate 201 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrates may be formed by selective epitaxial growth (SEG). Also alternatively, the substrate 201 may include a buried dielectric layer, such as a buried oxide (BOX) layer, such as that formed by separation by implantation of oxygen (SIMOX) technology, wafer bonding, SEG, or other appropriate process. An implantation process on the substrate and/or fin structures may facilitate the reduction of electrical resistance.

A p-type substrate or n-type substrate may be used and the substrate 201 may include various doped regions, depending on design requirements. In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type Fin FET, or alternatively configured for a p-type Fin FET. In this regard, individual fin structures may be formed in respective doped regions such that the fins may be doped with different dopants (e.g., a first doped region having a p-type dopant for a first fin structure can be located adjacent to a second doped region having an n-type dopant for a second fin structure).

Figure 2B:
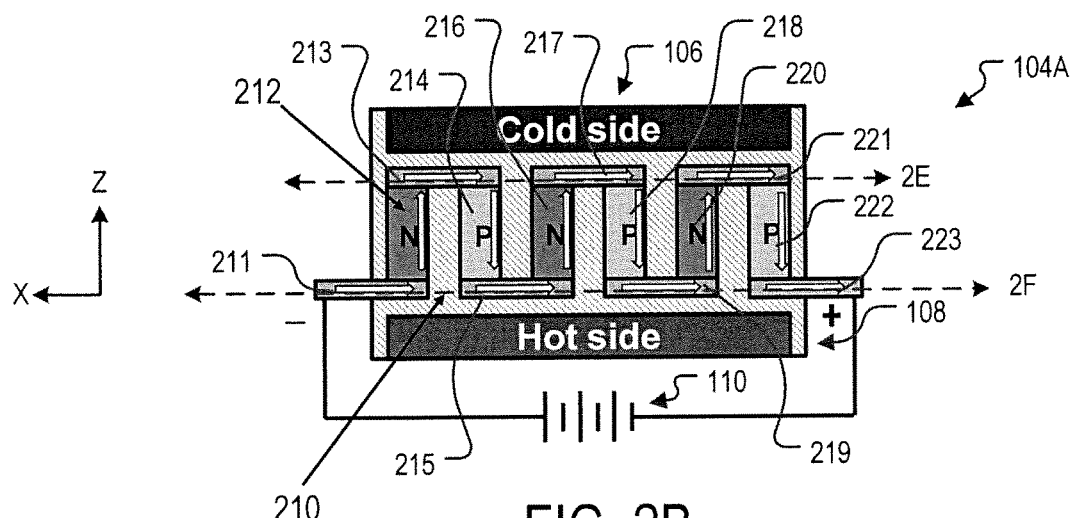
FIG. 2B illustrates an example of a first type of thermoelectric device in the first configuration in accordance with some embodiments of the present disclosure.

FIG. 2B illustrates an example of a first type of the thermoelectric device 104A in the first configuration in accordance with some embodiments of the present disclosure. A planar view of the thermoelectric device 104A included in the thermoelectric system 200 along an X-Z axis is illustrated. In this embodiment, the first type of thermoelectric device 104A is directed to the refrigeration mode where the thermoelectric device provides active cooling to the thermal conductive structure 106. In this example, the first configuration relates to the right-angle daisy chain of fin structures by series connection.

The thermoelectric device 104A is formed on the substrate 201 (FIG. 2A). The thermoelectric device 104A includes semiconductor fin structures 212, 214, 216, 218, 220 and 222. The thermoelectric device 104A also includes connecting layers 211, 213, 215, 217, 219, 221 and 223. In this embodiment, the first power circuit 110 is applied across the thermoelectric device 104A directing the electrical current flow through the n- and p-type semiconductor structures in the thermoelectric device 104A. In other words, the thermoelectric device 104A operates in a refrigeration mode.

In one or more implementations, an isolation layer 210 is disposed on the substrate 201 to increase boundary scattering event while keeping electrical isolation for the fin structures in the thermoelectric device 104A. In this example, the isolation layer 210 is formed around and between the fin structures such that at least a portion of the isolation layer 210 is formed beneath a channel region of each of the fin structures to constrain any current and/or heat in the fin structures and not allow the current and/or heat to pass to the substrate 201. In some aspects, one or more nanowires may be disposed on the substrate instead of the fin structures being formed on the substrate 201.

To give the thermoelectric device 104A a greater heat transfer capacity, multiple fin structures may be employed. In one or more implementations, the thermoelectric device 104A includes multiple fin structures having alternating types of semiconductor structures (e.g., n- or p-type) arranged in series and multiple connecting layers (or interconnect layers) disposed on the fin structures, in which each of the connecting layers is arranged adjacent to one end of each of the fin structures such that the fin structures and connecting layers form a daisy chain. For example, the daisy chain of fin structures may be arranged as n-type followed by p-type then followed by n-type preceding another p-type and so on, but the ordering of n- and p-type semiconductor structures is not limited to the arrangement shown in the figures. In this embodiment, electrical current flows in series while thermal flow moves from the thermal conductive structure 106 toward the thermal conductive structure 108 in order to release the absorbed heat while actively cooling the thermal conductive structure 106.

For an n-type semiconductor structure in the thermoelectric device 104A, electrons are employed as the charge carrier for heat transfer. With the first power circuit 110 connected as shown, negative charge carriers (e.g., electrons) will be repelled by the negative pole and attracted to the positive pole of the voltage source (thus flowing in a clockwise direction). In effect, the heat is pumped by the charge carriers through the thermoelectric device 104A. For a p-type semiconductor structure in the thermoelectric device 104A, holes are the charge carriers employed for the heat transfer. The holes can enhance the electrical conductivity of the p-type semiconductor structure, allowing the electrons to flow more freely through the material when the first power circuit 110 is applied. Positive charge carriers (e.g., holes) will be repelled by the positive pole and attracted to the negative pole (thus flowing in a counterclockwise direction), thus the hole current flows in a direction opposite to that of the electron flow. In this regard, use of the p-type semiconductor structure results in heat being drawn toward the negative pole of the voltage source and away from the positive pole of the first power circuit 110. In this embodiment, the electrons flow continuously from the negative pole of the first power circuit 110, through the n-type semiconductor, through one of the connecting layers, through the p-type semiconductor, and back to the positive pole of the first power circuit 110. The first power circuit 110 may be a voltage source, a capacitor, a charge repository, or the like.

The connecting layer 211 may be disposed on a first end of the fin structure 212 and the connecting layer 213 disposed on a second end of the fin structure 212. In one or more implementations, the second end of the fin structure 212 is electrically coupled to a second end of the second fin structure 214 via the connecting layer 213. In some implementations, the thermoelectric device 104A includes a connecting layer 215 disposed on a first end of the second fin structure 214. In this example, the fin structure 212 represents an n-type semiconductor structure while the fin structure 214 represents a p-type semiconductor structure, but the n- and p-type assignment can vary depending on implementation. In one or more implementations, the connecting layers 211, 213, 215, 217, 219, 221 and 223 each includes a conductive material (or a metal).

The thermal conductive structure 106 may be located near the second end of the fin structure 212. The thermal conductive structure 108 may be located near the first end of the fin structure 212. In this example, the thermal conductive structures 106 and 108 are metal structures that carry thermal energy, such as heat, which impact the electron current flow through the fin structure 212 and the connecting layers 211 and 213.

The fin structure 212 is arranged in parallel to the second fin structure 214. In this embodiment, the second end of the fin structure 212 and the first end of the second fin structure 214 are opposing ends. The fin structure 212 is arranged orthogonal to the first connecting layer 211 and the connecting layer 213. In this arrangement, the first connecting layer 211 and the connecting layer 215 are disposed in series along an axis parallel to the connecting layer 213.

The first power circuit 110 may be electrically coupled to the connecting layer 211 and the connecting layer 223. For example, the connecting layer 211 may be electrically coupled to a first terminal (e.g., the negative pole) of the first power circuit 110 and the connecting layer 223 is electrically coupled to a second terminal (e.g., the positive pole) of the first power circuit 110. The direction of electron current flow through the fin structure 212 may be from an interface with the first connecting layer 211 to an interface with the connecting layer 213 since the electrons are repelled by the negative terminal of the first power circuit 110. Alternatively, the direction of electron current flow may be based on the diffusion of electrons from the hot side to the cold side. The direction of current flow through the second fin structure 214 is from an interface with the connecting layer 213 to an interface with the connecting layer 215.

In this embodiment, the thermal conductive structure 106 is designated as the cold side while the thermal conductive structure 108 is designated as the hot side. In some embodiments, the thermal conductive structure 108 is designated as the cold side while the thermal conductive structure 106 is designated as the hot side depending on implementation of the first power circuit 110 and disposition of the operating circuit 102. As the electron current flows from a hot side to the p-type semiconductor structure, the electrons release energy in the form of heat to enter the p-type semiconductor structure as an electron-hole pair. The released energy heats the heat sink element (e.g., the thermal conductive structure 106). Conversely, the electrons absorb energy as it passes through the thermal conductive structure 108 and again as the electron enters the n-type semiconductor structure. The heat absorption results in active cooling in the thermal conductive structure 108. Finally, the electrons leave the n-type semiconductor structure, thus releasing the absorbed heat into the heat sink element.

In some aspects, the current flow may be adjusted by the first power circuit 110 electrically coupled to the thermoelectric device 104A. In this example, the amount of potential applied across the thermoelectric device 104A can control the amount of additional power used to cool down the operating circuit temperature, thereby adjusting the amount of cooling.

Figure 2C:
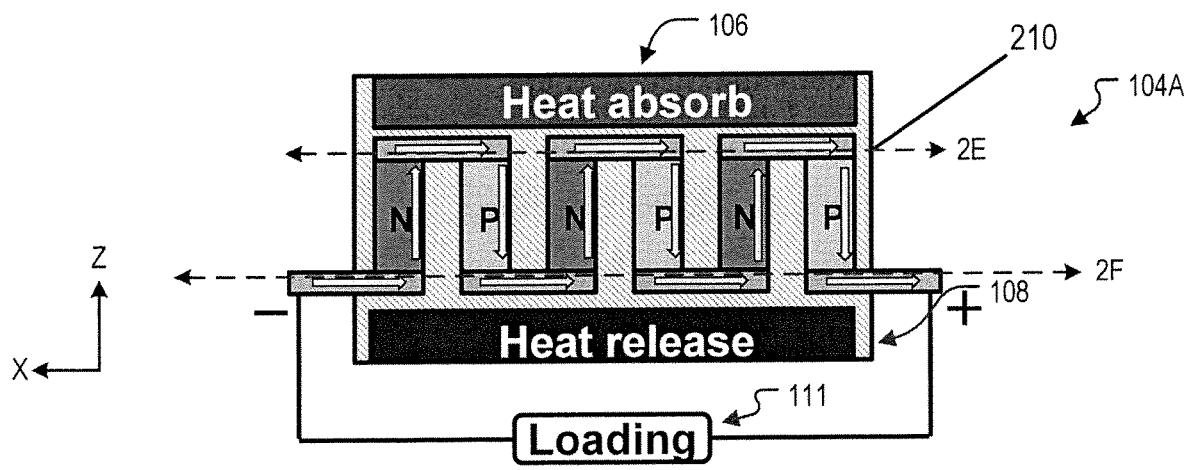
FIG. 2C illustrates an example of a second type of thermoelectric device in the first configuration in accordance with some embodiments of the present disclosure.

FIG. 2C illustrates an example of a second type of the thermoelectric device 104A in the first configuration in accordance with some embodiments of the present disclosure. A planar view of the thermoelectric device 104A included in the thermoelectric system 200 along an X-Y axis is illustrated. In this embodiment, the second type of the thermoelectric device 104A is directed to the power generation mode where the thermoelectric device may provide recycled energy back toward the second power circuit 112 (FIG. 1B). In this example, the first configuration relates to the daisy chain of fin structures by series connection.

Because FIGS. 2B and 2C share very similar features and components, only differences will be discussed with reference to FIG. 2C. In this embodiment, the thermal conductive structure 106 is designated as the hot side (or heat absorb side) while the thermal conductive structure 108 is designated as the cold side (or heat release side). During operation, the fin structure 212 absorbs heat from a hot side (e.g., the thermal conductive structure 106) toward the other thermal conductive structure, which causes a current flow through the fin structure 212. Charges can build up when the electrons and the holes migrate towards the cold side leaving behind charged donors/acceptors. This charge forms an electric field that causes a backflow of current for generating additional power in the thermoelectric device 104A, thereby recycling the wasted energy as part of the power generation. In this regard, the backflow of current may be fed back via a power transmission line (152 shown in FIG. 1B) to the second power circuit 112. In this case, the second power circuit functions as the load circuit 111 of FIG. 2C.

Figure 2D:
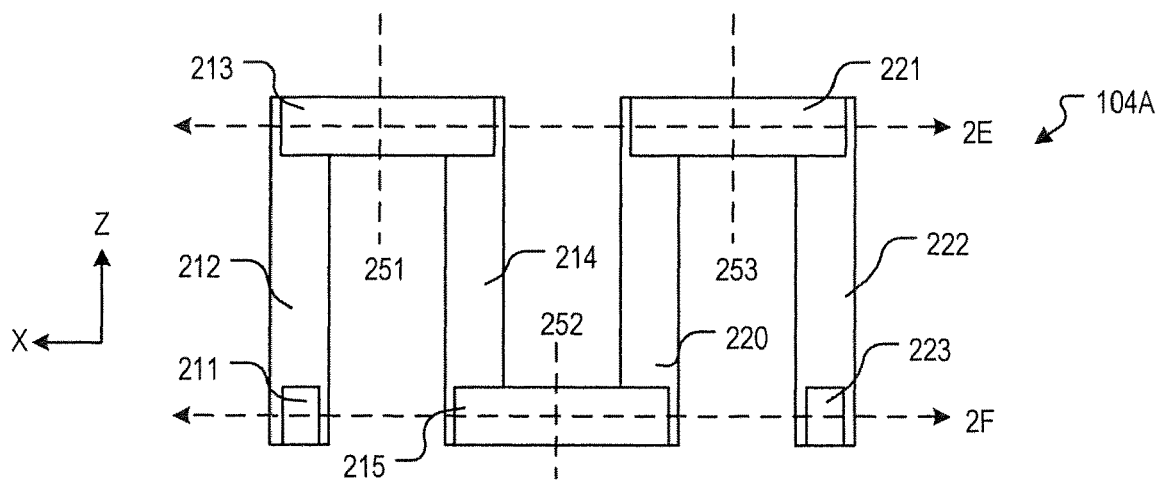
FIG. 2D is a top view of the exemplary thermoelectric device in the first configuration in accordance with some embodiments of the present disclosure.

FIG. 2D is a top view of the exemplary thermoelectric device 104A in the first configuration in accordance with some embodiments of the present disclosure. A planar view of the thermoelectric device 104A along an X-Z axis is illustrated. In this example, the first configuration relates to the right-angle daisy chain of fin structures by series connection.

The fin structure 212 is arranged in parallel to the fin structure 214. Similarly, the fin structure 220 is arranged in parallel to the fin structure 222. In this regard, the fin structure 214 is also in parallel to the fin structure 220. In this embodiment, connecting layers are electrically coupled to opposing ends of the fin structures. In this regard, the fin structure 214 is arranged orthogonal to the connecting layer 213 and the connecting layer 215. In this arrangement, the connecting layer 213 and the connecting layer 221 are disposed in series along an axis parallel to the connecting layer 215.

Figure 2E:
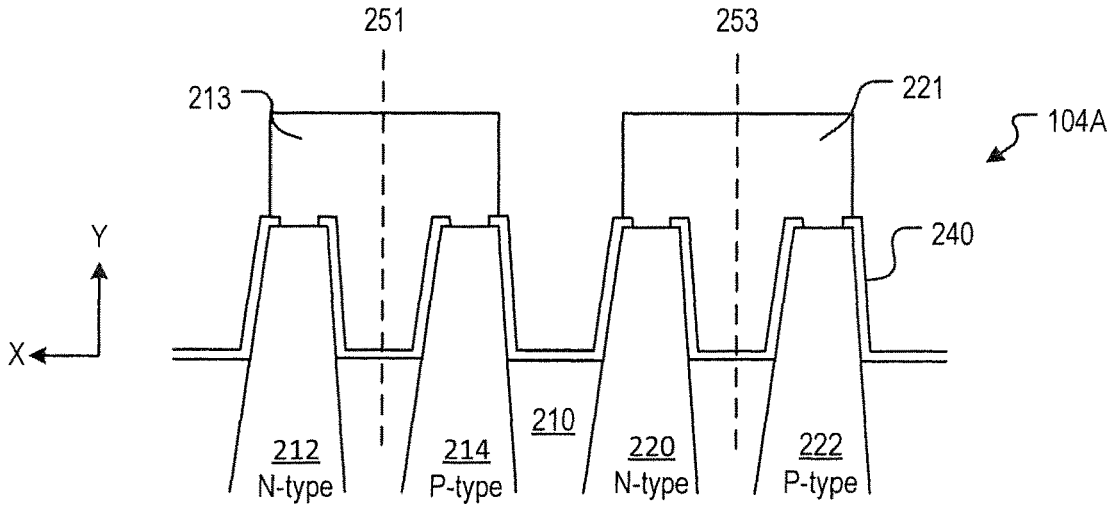
FIG. 2E is a cross-sectional view at a first end of the exemplary thermoelectric device in the first configuration in accordance with some embodiments of the present disclosure.
Figure 2F:
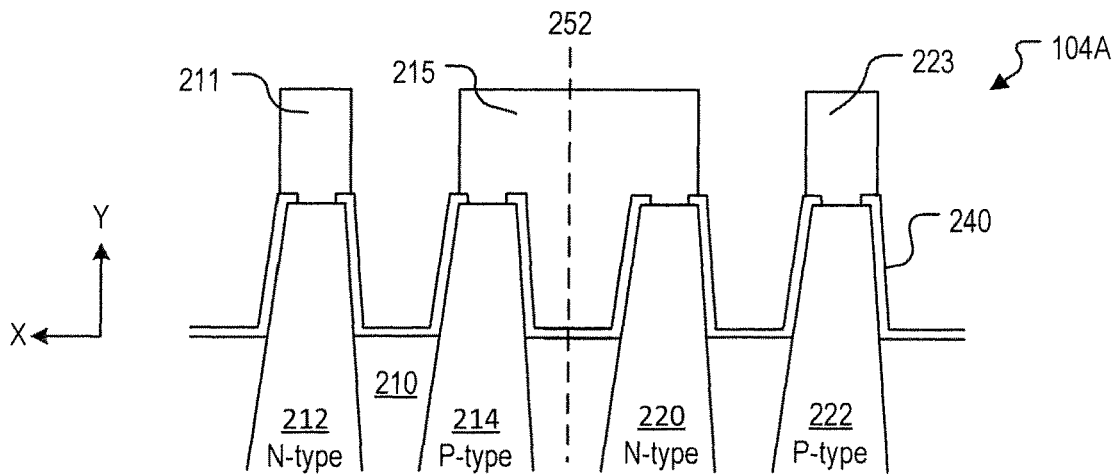
FIG. 2F is a cross-sectional view at a second end of the exemplary thermoelectric device in the first configuration in accordance with some embodiments of the present disclosure.

In FIGS. 2D-2F, reference markers 251-253 are included to keep a reference point on FIGS. 2E and 2F with respect to FIG. 2D. Axes 2E and 2F indicate where the cross-sectional views in FIGS. 2E and 2F are taken with respect to FIG. 2D.

FIG. 2E is a cross-sectional view at a first end of the exemplary thermoelectric device 104A in the first configuration in accordance with some embodiments of the present disclosure. The cross-sectional view of the thermoelectric device 104A is illustrated in an X-Y plane along the 2E axis. In one or more implementations, the thermoelectric device 104A includes a gate dielectric layer 240.

The dielectric layer 240, which may be formed by the same layer as the gate dielectric layer in the operating circuit 102, may be disposed on the fin structures 212, 214, 220 and 222 such that the connecting layer 213 can be electrically connected to the fin structures 212 and 214, and the connecting layer 221 can be electrically connected to the fin structures 220 and 222. The gate dielectric layer 240 can be used as an etching stopper when etching the gate (or polysilicon). If no gate dielectric layer is present, then a fin structure containing Si materials also can be etched when etching the poly gate. Before forming the connecting layer, at least a portion of the gate dielectric layer 240 formed over the fin structures 212, 214, 220 and 222 is removed to make a contact opening (or hole) to electrically connect the fin structures with the connecting layers. In one embodiment, the connecting layer 213 is electrically coupled to the fin structures 212 and 214 via the formed openings through the gate dielectric layer 240. Although the opening is formed on the top of the fin structures in FIG. 2E, the opening may have a large size to expose at least part of the side wall of the fin structures in some embodiments.

FIG. 2F is a cross-sectional view at a second end of the exemplary thermoelectric device 140 in the first configuration in accordance with some embodiments of the present disclosure. The cross-sectional view of the thermoelectric device 104A is illustrated in an X-Y plane along the 2F axis. In this embodiment, the second end is more proximate to the thermal conductive structure 108 than the first end. In this example, the connecting layer 211 is electrically coupled to the fin structure 212 via the openings formed in the gate dielectric layer 240, the connecting layer 215 is electrically coupled to the fin structures 214 and 220, and the connecting layer 223 is electrically coupled to the fin structure 222. The connecting layers 211, 215, 221 and 223 may be formed by the same layer as gate electrodes in the operating circuit 102.

Figure 3A:
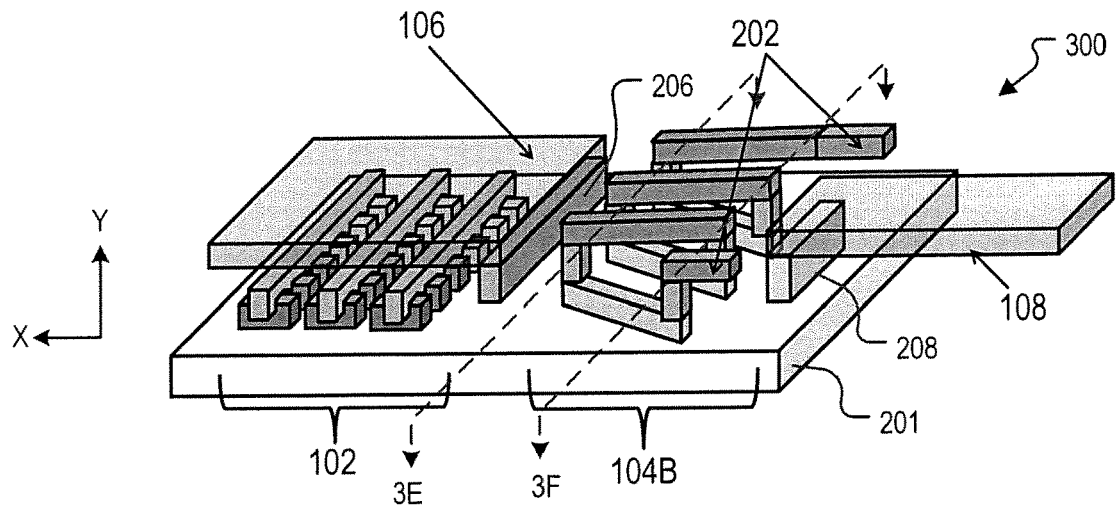
FIG. 3A is a perspective view of an exemplary thermoelectric system in a second configuration in accordance with some embodiments of the present disclosure.

FIG. 3A is a perspective view of an exemplary thermoelectric system 300 in a second configuration in accordance with some embodiments of the present disclosure. Not all of the depicted components may be required, however, and one or more implementations may include additional components not shown in the figure. Variations in the arrangement and type of the components may be made without departing from the scope of the claims as set forth herein. Additional components, different components, or fewer components may be provided. It is understood that additional operations can be provided before, during, and after operations shown by FIGS. 3A-3G, and some of the operations described below can be replaced or eliminated, for additional embodiments of the method. The order of the operations may be interchangeable.

Because FIGS. 2A and 3A share very similar features and components, only differences will be discussed with reference to FIG. 3A. A perspective view of the thermoelectric system 300 along an X-Y axis is illustrated. In this example, the second configuration relates to the zig-zag daisy chain of fin structures by series connection.

The thermoelectric system 300 includes fin structures in the second arrangement. The second arrangement includes fin structures connected in series in a zig-zag pattern. The zig-zag pattern is formed by the connecting layers connecting between opposing ends of parallel fin structures. During operation, the heat is transferred from the thermal conductive structure 106 to the thermal conductive structure 108 from left to right or right to left through the zig-zag pattern depending on implementation. The first and second power interconnect structures 202 may be disposed on connecting layers located at distal ends of the zig-zag pattern to connect the thermoelectric device 104B to an external power source (e.g., the first power circuit 110).

Figure 3B:
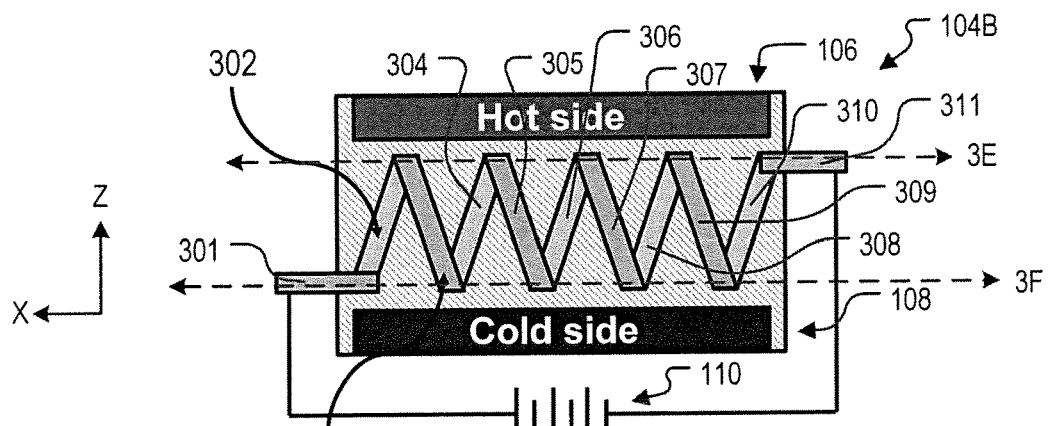
FIG. 3B illustrates an example of a first type of thermoelectric device in the second configuration in accordance with some embodiments of the present disclosure.

FIG. 3B illustrates an example of a first type of the thermoelectric device 104B in the second configuration in accordance with some embodiments of the present disclosure. In some embodiments, the second arrangement includes fin structures arranged non-orthogonal to the connecting layers such that the fin structures and connecting layers form a series-connected zig-zag pattern, but the series-connected pattern may vary depending on implementation. In this embodiment, the first type of the thermoelectric device 104B is directed to a refrigeration mode.

The thermoelectric device 104B is formed on the substrate 201 (FIG. 2A). The thermoelectric device 104B includes semiconductor fin structures 302, 304, 306, 308 and 310. The thermoelectric device 104B also includes upper connecting layers 301, 303, 305, 307, 309 and 311. In some aspects, the thermoelectric device 104B includes connecting layers (see FIGS. 3E, 3F) disposed between the fin structures and the upper connecting layers.

In some embodiments, the fin structure 304 and the fin structure 306 are n-type semiconductors, in which the direction of current flow through the fin structure 304 is from the upper connecting layer 303 to the upper connecting layer 305. The direction of current flow through the fin structure 306 is from the upper connecting layer 305 to the upper connecting layer 307. In this arrangement, the upper connecting layer 305 is coupled to opposing ends of the fin structures 304 and 306. Similarly, the upper connecting layer 305 and the upper connecting layer 307 are coupled to opposing ends of the fin structure 306. In this embodiment, the upper connecting layer 305 and the upper connecting layer 307 are disposed in parallel of one another along a first axis while the fin structure 304 and the fin structure 306 are disposed in parallel of one another along a second axis which is non-orthogonal relative to the first axis. In this regard, the second arrangement represents a zig-zag pattern. During operation, the heat is transferred from the thermal conductive structure 106 toward the thermal conductive structure 108 from left to right through the zig-zag pattern. For example, the charged electrons absorb energy from the hot side as they pass through the n-type semiconductor structures and release the absorbed energy at the cold side.

In some implementations, the fin structure 304 and the fin structure 306 are p-type semiconductors, in which the direction of current flow through the fin structure 304 is from the upper connecting layer 305 to the upper connecting layer 303. The direction of current flow through the fin structure 306 is from the upper connecting layer 307 to the upper connecting layer 305. In this arrangement, the upper connecting layer 305 is coupled to opposing ends of the fin structures 304 and 306. Similarly, the upper connecting layer 305 and the upper connecting layer 307 are coupled to opposing ends of the fin structure 306. In this embodiment, the upper connecting layer 305 and the upper connecting layer 307 are disposed in parallel of one another along a first axis while the fin structure 304 and the fin structure 306 are disposed in parallel of one another along a second axis which is non-orthogonal relative to the first axis. In this regard, the second arrangement represents a zig-zag pattern. During operation, the heat is transferred from the thermal conductive structure 106 toward the thermal conductive structure 108 from right to left through the zig-zag pattern.

Figure 3C:
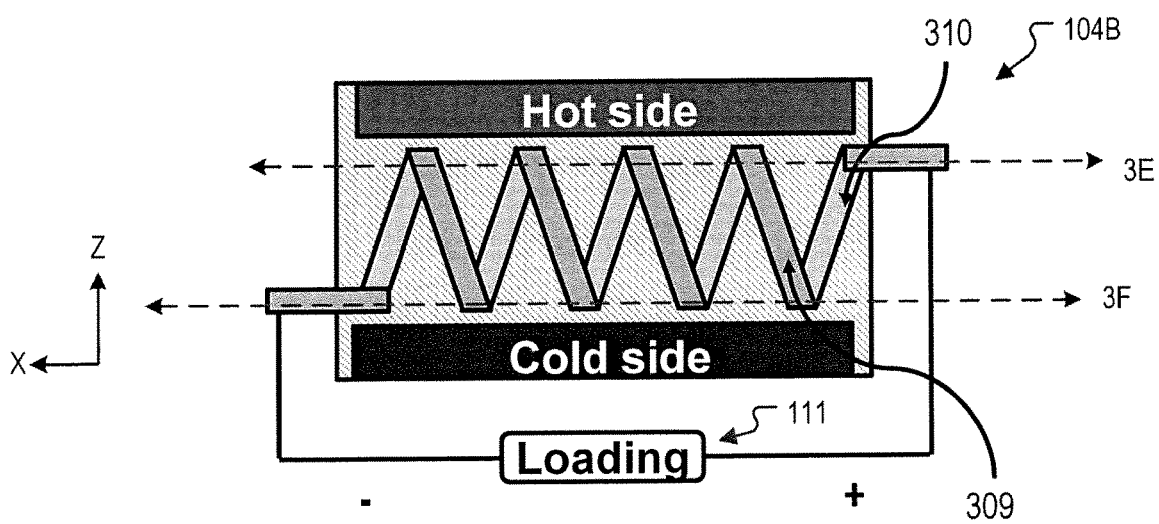
FIG. 3C illustrates an example of a second type of thermoelectric device in the second configuration in accordance with some embodiments of the present disclosure.

FIG. 3C illustrates an example of the second type of thermoelectric device 104B in the second configuration in accordance with some embodiments of the present disclosure. In this embodiment, the second type of the thermoelectric device 104B is directed to the power generation mode where the thermoelectric device provides recycled energy back toward the second power circuit 112 (FIG. 1B).

Because FIGS. 3B and 3C share very similar features and components, only differences will be discussed with reference to FIG. 3C. In this embodiment, the thermal conductive structure 106 is designated as the hot side (or heat absorb side) while the thermal conductive structure 108 is designated as the cold side (or heat release side). During operation, the series-connected fin structures absorb heat from the hot side (e.g., the thermal conductive structure 106) toward the other thermal conductive structure 108 based on a direction of current flow through the series-connected fin structures.

During operation, the heat is transferred from the thermal conductive structure 106 to the thermal conductive structure 108 from left to right through the zig-zag pattern when n-type semiconductors are implemented (due to the negative charge carrier flow from the negative pole to the positive pole). For example, the charged electrons absorb energy from the hot side as they pass through the n-type semiconductor structures and release the absorbed energy at the cold side. Alternatively, the heat is transferred from the thermal conductive structure 106 to the thermal conductive structure 108 from right to left through the zig-zag pattern when p-type semiconductors are implemented (due to the positive charge carrier flow from the positive pole to the negative pole). For example, the charged holes absorb energy from the hot side as they pass through the p-type semiconductor structures and release the absorbed energy at the cold side.

Figure 3D:
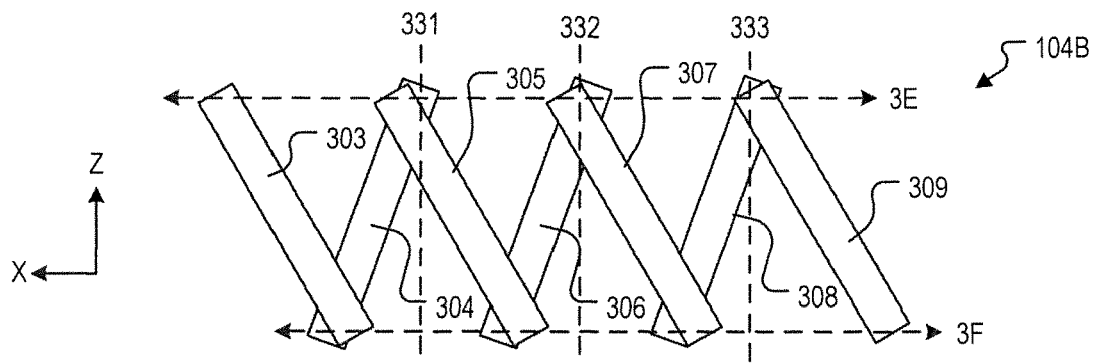
FIG. 3D is a top view of the exemplary thermoelectric device in the second configuration in accordance with some embodiments of the present disclosure.

FIG. 3D is a top view of the exemplary thermoelectric device 104B in the second configuration in accordance with some embodiments of the present disclosure. A planar view of the thermoelectric device 104B along an X-Z axis is illustrated. In this example, the second configuration relates to the zig-zag daisy chain of fin structures by series connection.

The fin structure 304 is arranged in parallel to the fin structure 306. Similarly, the fin structure 306 is arranged in parallel to the fin structure 308. In this embodiment, connecting layers are electrically coupled to opposing ends of the fin structures. In this regard, the fin structure 304 is arranged non-orthogonal to the upper connecting layer 305 and the upper connecting layer 307.

Figure 3E:
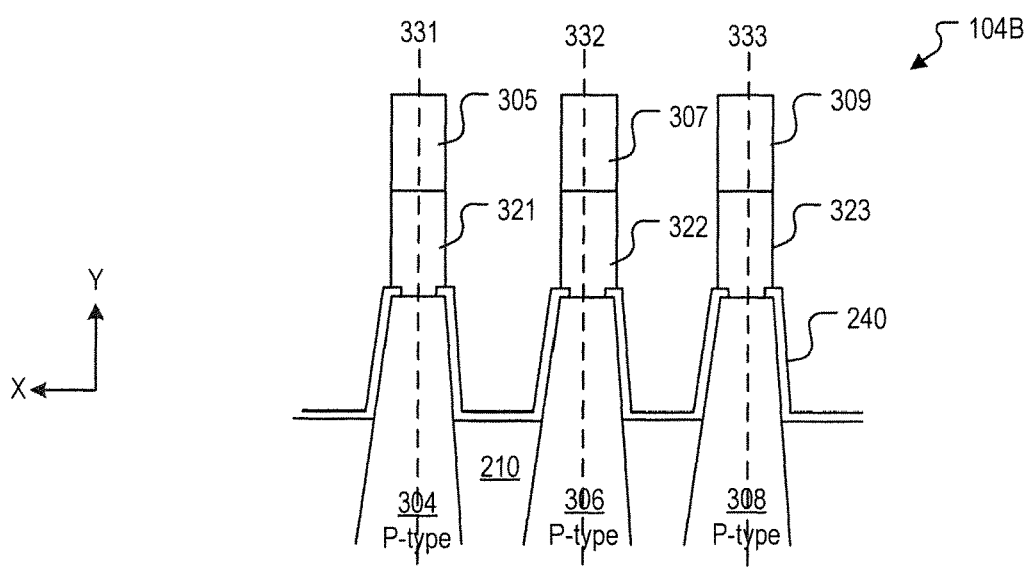
FIG. 3E is a cross-sectional view at a first end of the exemplary thermoelectric device in the second configuration in accordance with some embodiments of the present disclosure.
Figure 3F:
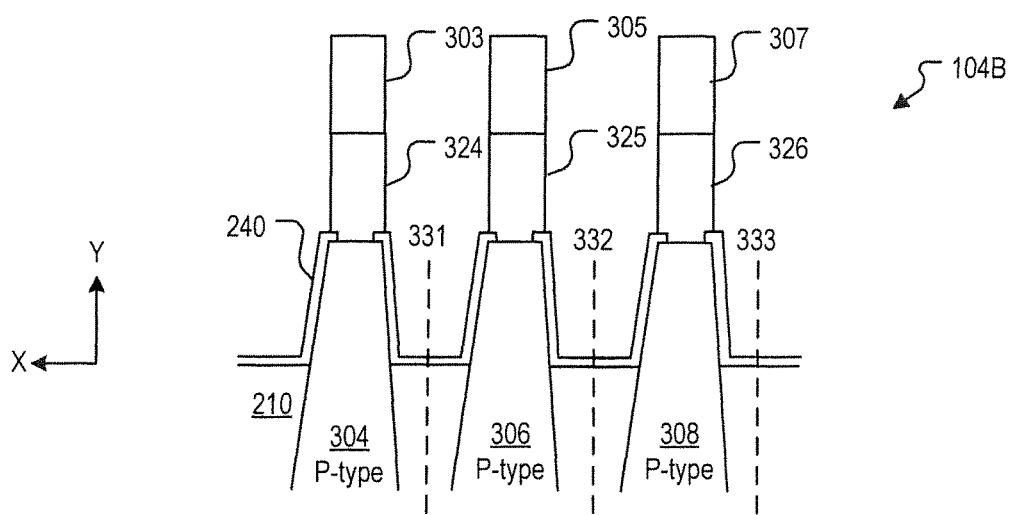
FIG. 3F is a cross-sectional view at a second end of the exemplary thermoelectric device in the second configuration in accordance with some embodiments of the present disclosure.

In FIGS. 3D-3F, reference markers 331-333 are included to keep a reference point on FIGS. 3E and 3F with respect to FIG. 3D. Axes 3E and 3F indicate where the cross-sectional views in FIGS. 3E and 3F are taken with respect to FIG. 3D.

FIG. 3E is a cross-sectional view at a first end of the exemplary thermoelectric device 104B in the second configuration in accordance with some embodiments of the present disclosure. The cross-sectional view of the thermoelectric device 104B is illustrated in an X-Y plane along the 3E axis. In one or more implementations, the thermoelectric device 104B includes a gate dielectric layer 240.

The gate dielectric layer 240 may be disposed on the fin structures 304, 306 and 308 such that a connecting layer 321 can be electrically connected to the fin structure 304, a connecting layer 322 can be electrically connected to the fin structure 306, and a connecting layer 323 can be electrically connected to the fin structure 308. The upper connecting layers 305, 307 and 309 are formed on the connecting layers 321-323, respectively, along the axis 3E. In this embodiment, the connecting layers 321-323 are raised (or vertical structures). In this regard, the upper connecting layers 305, 307 and 309 are stacked on top of respective gate layers to form a multilayered structure at a junction end of the respective fin structure. In some embodiments, two adjacent fins are connected by a gate layer. In other embodiments, the two adjacent fins are connected by a conductive layer, which is disposed on an upper layer of the gate layer, via the gate layer.

FIG. 3F is a cross-sectional view at a second end of the exemplary thermoelectric device 104B in the second configuration in accordance with some embodiments of the present disclosure. The cross-sectional view of the thermoelectric device 104B is illustrated in an X-Y plane along the 3F axis. In this embodiment, the second end of the fin structures are more proximate to the thermal conductive structure 108 than the first end. In this example, the connecting layers 324-326 are electrically coupled to the fin structures 304, 306 and 308, respectively, via the openings formed in the gate dielectric layer 240. In this embodiment, the connecting layers 324-326 are raised (or vertical structures). Like FIG. 3E, the upper connecting layers 303, 305 and 307 are formed on the connecting layers 324-326, respectively, along the axis 3F, such that the upper connecting layers 303, 305 and 307 are stacked on top of respective gate layers to form a multilayered structure at a junction end of the respective fin structure.

Figure 3G:
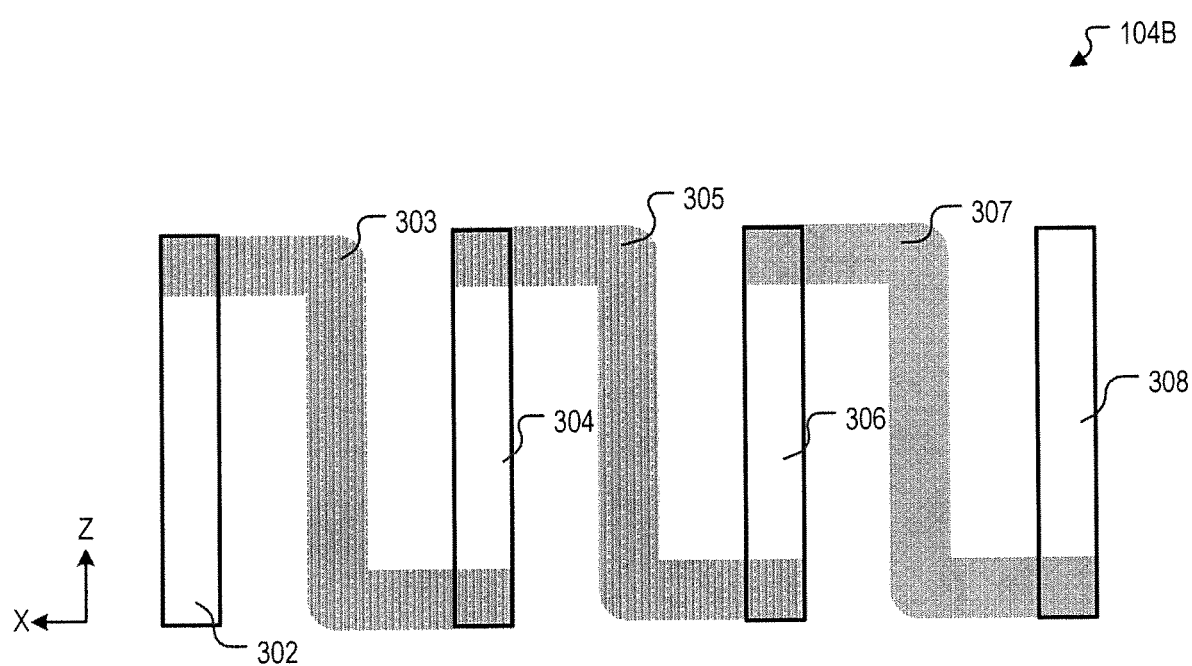
FIG. 3G is a top view of an alternative example of the thermoelectric device in the second configuration in accordance with some embodiments of the present disclosure.

FIG. 3G is a top view of an alternative example of the thermoelectric device 104B in the second configuration in accordance with some embodiments of the present disclosure. A planar view of the thermoelectric device 104B along an X-Z axis is illustrated. In this example, the second configuration relates to the zig-zag daisy chain of fin structures in series connection by arranging the upper connecting layer patterns orthogonal to each other.

The fin structure 302 is arranged in parallel to the fin structure 304. Similarly, the fin structure 304 is arranged in parallel to the fin structure 306, as to which the fin structure 306 is arranged in parallel to the fin structure 308. In this embodiment, the upper connecting layers 303, 305 and 307 are patterned such that segments of the upper connecting layers 303, 305 and 307 are orthogonal and electrically coupled to opposing ends of the fin structures. For example, the upper connecting layer 303 has a first segment orthogonal to the fin structure 302, a second segment orthogonal to the first segment (but parallel to the fin structure 302) and a third segment orthogonal to the fin structure 304 (but parallel to the first segment).

FIGS. 4A-8C illustrate examples of cross-sectional views of intermediate stages of a sequential process in the fabrication of an operating circuit and thermoelectric device using Fin FET technology in accordance with some embodiments of the present disclosure. In these figures, the discussion relating to the operating circuit 102 and thermoelectric device 104 is simplified for purposes of explaining features of the provided subject matter and the stages of Fin FET fabrication. In this regard, some layers/features are omitted or rearranged for simplification. Not all of the depicted components may be required, however, and one or more implementations may include additional components not shown in the figure. Variations in the arrangement and type of the components may be made without departing from the scope of the claims as set forth herein. Additional components, different components, or fewer components may be provided. It is understood that additional operations can be provided before, during, and after operations shown by FIGS. 4A-8C, and some of the operations described below can be replaced or eliminated, for additional embodiments of the method. The order of the operations may be interchangeable.

FIGS. 4A-4C illustrate planar views of the operating circuit 102 and thermoelectric device 104. In FIG. 4A, a planar view of Fin FET portions in the operating circuit 102 along an X-Z axis is illustrated. In FIG. 4B, a planar view of the thermoelectric device 104A along the X-Y axis is illustrated. In FIG. 4C, a planar view of the thermoelectric device 104B along the X-Y axis is illustrated.

As shown in FIGS. 4A and 4B, the underlying semiconductor substrate 201 is patterned to form fin structures 401, 402, 212 and 214 arranged in strips parallel to each other, and closely spaced with respect to each other. However, the number of fin structures is not limited to two. The numbers may be one, three or four or more. In FIG. 4C, the underlying semiconductor substrate 201 is patterned to form fin structures 306 and 308 in a zig-zag arrangement. For example, mask patterns may be disposed in contact with one another in a parallel arrangement or in a non-parallel and non-orthogonal arrangement such that the fin patterning would yield fins in a parallel arrangement or in a zig-zag arrangement.

For FIGS. 4A-4C, the following operations may take place as part of the sequential process in fabricating the operation circuit 102 and the thermoelectric device 104. In some embodiments, a pad layer and a mask layer are formed on the semiconductor substrate 201. The pad layer may be a thin film having silicon oxide formed, for example, using a thermal oxidation process. The pad layer may act as an adhesion layer between the semiconductor substrate 201 and the mask layer. The pad layer may also act as an etch stop layer for etching the mask layer. In at least one embodiment, the mask layer is formed of silicon nitride, for example, using low-pressure chemical vapor deposition (LPCVD) or plasma enhanced chemical vapor deposition (PECVD). The mask layer is used as a hard mask during subsequent patterning processes. A photoresist layer is formed on the mask layer and is then patterned by a photolithography patterning process, forming openings in the photoresist layer. The photoresist layer may be removed after patterning of the mask layer and pad layer and before the trench etching.

The photoresist layers are disposed relative to one another such that fin structures 401 and 402 may be patterned in a desired arrangement. The mask layer and pad layer are etched to expose underlying substrate 201. The exposed substrate 201 is then trench-etched to form trenches by using the patterned mask layer and pad layer as a mask. In the trench etching process, the substrate 201 may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., $HBr$ and/or $CHBr_3$), oxygen-containing gas, iodine-containing gas, other suitable gases and/or plasmas, or combinations thereof. Next, a wet cleaning operation may be performed to remove a native oxide of the semiconductor substrate 201. The cleaning may be performed using dilute hydrofluoric (DHF) acid.

Portions of the substrate 201 between the trenches form the fin structures 401 and 402. Each of the fin structures 401 and 402 may have a width W and a length L, and are spaced apart from an adjacent fin by a width S. For example, the width W of the fin structures 401 and 402 may be in a range of about 7 nm to about 70 nm in some embodiments. In some embodiments, the fin structures 212, 214, 306 and 308 have similar dimensions as the fin structures 401 and 402.

The trenches are filled with one or more layers of dielectric materials. The dielectric materials may include silicon oxide. In one or more implementations, the dielectric materials may be made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed.

In some embodiments, other dielectric materials, such as silicon nitride, silicon oxynitride, fluoride-doped silicate glass (FSG), or a low-K dielectric material, may also be used to form the dielectric material. In an embodiment, the dielectric material is formed using a high-density-plasma (HDP) CVD process, using silane ($SiH_4$) and oxygen ($O_2$) as reacting precursors. In other embodiments, the dielectric material may be formed using a sub-atmospheric CVD (SACVD) process or high aspect-ratio process (HARP), in which process gases may include tetraethylorthosilicate (TEOS) and/or ozone ($O_3$). In yet other embodiments, the dielectric material may be formed using a spin-on-dielectric (SOD) process, such as hydrogen silsesquioxane (HSQ) or methyl silsesquioxane (MSQ). In some embodiments, the filled recess region may have a multi-layer structure such as a thermal oxide liner layer filled with silicon nitride or silicon oxide.

After the deposition of the one or more layers of dielectric materials, a planarization operation such as a chemical mechanical polish (CMP) and/or an etch-back process is then performed, followed by the removal of the mask layer and pad layer. An annealing process may be performed after the trenches are filled with the one or more dielectric materials and/or after the planarization operation. The annealing process includes rapid thermal annealing (RTA), laser annealing processes, or other suitable annealing processes.

In at least one embodiment, the mask layer is formed of silicon nitride such that the mask layer may be removed using a wet process using $H_3PO_4$. The pad layer may be removed using dilute HF acid, if the pad layer is formed of silicon oxide. The remaining portions of the dielectric material in the trenches are hereinafter referred to as isolation regions 210. In some embodiments, the removal of the mask layer and the pad layer is performed after the recessing of the isolation regions 210.

An etching process may be performed to etch the isolation regions 210 to expose upper portions of the fin structures 401, 402, 212, 214, 306 and 308 above the isolation regions 210. The etching process may include a dry etching process, wet etching process, or combination dry and wet etching processes to remove portions of the isolation regions 210. It is understood that the etching process may be performed as one etching process or multiple etching processes.

For FIGS. 5A-5C, a gate dielectric layer 240 is formed to cover at least a portion of an exposed fin region 403 of the fin structures 401 and 402. Similarly, the gate dielectric layer 240 may be disposed on the fin structures 212, 214, 306 and 308 and opening are formed by patterning operations such that a connecting layer can be electrically connected to the fin structures 212 and 214, and a connecting layer can be electrically connected to the fin structures 306 and 308. The gate dielectric layer 240 can be used as an etching stopper when etching the gate (or polysilicon). If no gate dielectric layer is present, then a fin structure containing Si materials also can be etched when etching the poly gate. Before forming the connecting layer, at least a portion of the gate dielectric layer 240 formed over the fin structures 212, 214, 306 and 308 is removed to make a contact opening (or hole) to electrically connect the fin structures with the connecting layers.

The gate dielectric layer 240 may include a single layer or a multilayer structure. In some embodiments, the gate dielectric layer 240 includes one or more layers of silicon oxide, silicon nitride, silicon oxy-nitride, or high-k dielectrics. High-k dielectrics may include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. Other examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 240 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 240 may further include one or more interfacial layers (not shown) to reduce damage between the gate dielectric layer 240 and the fin structures 401 and 402 in some embodiments. The one or more interfacial layers may include silicon oxide. A blanket layer of the gate dielectric layer 240 may be formed by CVD, PVD, ALD, or other suitable technique.

In FIG. 6A, a gate electrode layer 602 is then formed on the gate dielectric layer 240. Part of the fin region 403 not covered by the gate electrode layer 602 functions as a source and/or drain of the operating circuit 102. In at least one embodiment, the gate electrode layer 602 covers the fin region 403 of more than one of the two fin structures 401 and 402, so that the resulting n-type Fin FET device (e.g., the operating circuit 102) includes more than one fin structure. In some alternative embodiments, each of the fin regions 403 of the fin structures 401 and 402 is used to form a different Fin FET device (e.g., n- or p-type fins depending on dopant applied).

In FIG. 6B, a connecting layer 213 is formed on distal ends of the two fin structures 212 and 214 to create a charge carrier path through the two fin structures 212 and 214. In some aspects, the two fin structures 212 and 214 may have different dopants such that one fin is an n-type fin and the other is a p-type fin. For example, the connecting layer 213 may be disposed on drain ends of the two fin structures 212 and 214. The charge carrier path through the connecting layer 213 would allow electrical current to travel from a source end to the drain end of a p-type fin, then through the connecting layer 213, and then from the drain end to a source end of an n-type fin.

In FIG. 6C, a connecting plug 325 is formed on a distal end of the fin structure 306 while a connecting plug 326 is formed on a distal end of the fin structure 308 to create a charge carrier path through the two fin structures 306 and 308. The two fin structures 306 and 308 have the same dopants such that they are of the same type. In this regard, the connecting layer 414 may be formed as a leg between the two fin structures 306 and 308. In this example, the two fin structures 306 and 308 and the connecting plugs 325 and 326 are part of the zig-zag arrangement. It is noted that layers 602, 213 and plugs 325 and 326 are formed at the same time.

In one embodiment of the present disclosure, the connecting layer 213 and plugs 325 and 326 are made of the same material and formed at the same time as the gate electrode layer 602. However, in other embodiments, the connecting layers may be separately formed from the gate electrode layer 602 and may be made by an upper metal wiring layer.

The gate electrode layer 602 may include a single layer or a multilayer structure. The gate electrode layer 602 may include poly-silicon. Further, the gate electrode layer 602 may be doped poly-silicon with the uniform or non-uniform doping. In some alternative embodiments, the gate electrode layer 602 may include a metal such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other conductive materials with a work function compatible with the substrate material, or combinations thereof. The gate electrode layer 602 may be formed using a suitable process such as ALD, CVD, PVD, plating, or combinations thereof. In some embodiments, a hard mask layer (not shown), which has been used to pattern a poly silicon layer.

In certain embodiments of the present disclosure, one or more work function adjustment layers (not shown) may be interposed between the gate dielectric layer 240 and the gate electrode layer 602. The work function adjustment layer may include a single layer or alternatively a multi-layer structure, such as various combinations of a metal layer with a selected work function to enhance the device performance, liner layer, wetting layer, adhesion layer, metal alloy or metal silicide. The work function adjustment layers are made of a conductive material such as a single layer of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials, or a multilayer of two or more of these materials. In some embodiments, the work function adjustment layer may include a first metal material for an n-type Fin FET and a second metal material for a p-type Fin FET. For example, the first metal material for the n-type Fin FET may include metals having a work function substantially aligned with a work function of the substrate conduction band, or at least substantially aligned with a work function of the conduction band of the fin region 403. Similarly, for example, the second metal material for the p-type Fin FET may include metals having a work function substantially aligned with a work function of the substrate valence band, or at least substantially aligned with a work function of the valence band of the fin region 403. In some embodiments, the work function adjustment layer may alternatively include a polysilicon layer. The work function adjustment layer may be formed by ALD, PVD, CVD, e-beam evaporation, or other suitable process. Further, the work function adjustment layer may be formed separately for the n-type Fin FET and the p-type Fin FET, which may use different metal layers. In other embodiments, the work function adjustment layer is also applied to the thermoelectric device 104 in the same operation such that one or more work function adjustment layers may be interposed between the gate dielectric layer 240 and the connecting layer 213 of the fin structures 212 and 214, among others.

In one or more implementations, a strained material (not shown) is selectively grown on the surface of the fin region 403 of the fin structures 401 and 402 of the operating circuit 102. In some aspects, the strained material may be extended over the isolation regions 410. Since the lattice constant of the strained material is different from the fin region 403 of the fin structures 401 and 402, the fin region 403 of the fin structures 401 and 402 is strained or stressed to enable carrier mobility of the device and enhance the device performance. The strained material may be formed separately with respect to each fin or may be connected (or merged), depending on implementation.

In at least one embodiment, the strained material, such as silicon carbon (SiC) and/or silicon phosphide (SiP), is epitaxially grown by a LPCVD process to form the source and drain regions of an n-type Fin FET device. In at least another embodiment, the strained material, such as silicon germanium (SiGe), is epitaxially grown by a LPCVD process to form the source and drain regions of a p-type Fin FET device.

In some aspects, the n-type Fin FET is covered by, for example, silicon nitride such that the n-type Fin FET is protected during the recess and source/drain formation in the p-type Fin FET. After the strained material is formed for the p-type Fin FET, the p-type Fin FET is covered by silicon nitride layer, and then similar operations including recess formation and strain material formation are performed on the n-type Fin FET.

With respect to the thermoelectric device 104, each of the fin structures 212, 214, 306 and 308 can be covered by a silicon nitride layer while operations including fin recess formation (for epitaxial growth region) and strain material formation are performed on the fin structures 401 and 402.

In FIGS. 7A-7C, an operation of depositing a contact etch stop layer (CESL) may be performed after formation of the metal layer structure. In this example, the CESL may be applied as a layer uniformly over the operating circuit 102 and the thermoelectric device 104.

The CESL process may be followed by an operation of depositing an interlayer dielectric (ILD) layer 721. The ILD layer 721 may be deposited by a suitable technique, such as CVD. In this example, the ILD layer 721 may be applied as a layer uniformly over the operating circuit 102 and the thermoelectric device 104. The ILD layer 721 may include one or more layers of dielectric materials, such as silicon oxide, silicon nitride, a low-k dielectric material or a combination thereof.

In FIGS. 8A and 8C, a metal layer structure is formed. The ILD layer 721 may be subsequently planarized by a CMP operation, and electrodes may be formed by an operation of patterning the ILD layer 721 and deposition of a conductive material.

In FIG. 8B, each of the fin structures 212 and 214 including the connecting layer 213 remain covered by the ILD layer 721 while operations including metal layer formation are performed on the fin structures 401 and 402 of the operating circuit 102 (see FIG. 8A). For example, the thermal conductive structure 106 may be formed as the metal layer structure on the gate electrode layer 602 of the operating circuit 102. In some embodiments, the thermal conductive structure 106 is formed above the gate electrode layer 602 including the fin structures 401 and 402 with one or more intermediate layers disposed between the thermal conductive structure 106 and the gate electrode layer 602.

In some embodiments, connecting plugs 325, 326 connecting the underlying fin structures 306, 308 and the connecting layers 305, 307 may be formed as shown in FIG. 8C. The connecting plugs are formed by the same layer as the gate electrode layer 602. After forming the ILD layer 721, openings for the connecting layers 305, 307 are formed, and then the openings are filled with a conductive material. A suitable conductive material, such as copper, tungsten, nickel, titanium, or the like, is deposited in the openings. In some embodiments, a metal silicide is formed at the gate electrode layer and/or connecting layer interface to improve conductivity at the interface. In one example, a damascene and/or dual damascene process is used to form copper-based multilayer interconnection structures. In another embodiment, tungsten is used to form tungsten plugs in the openings. In one or more implementations, an alloy of Si or Ge and a metal such as Co, Ni, W, Ti or Ta may be formed on the source and drain regions of the fin structures 401 and 402.

In the above embodiments, the connecting plugs are formed for the zig-zag arrangement of FIG. 8C. However, the connecting plugs may be employed in the structure of FIG. 8B, and the zig-zag arrangement of FIG. 8C may be manufactured without the connecting plugs similar to the structure of FIG. 8B.

In some embodiments, a gate last method is implemented. In other embodiments, a gate first method is implemented. The methods are the same through the operation of removing a portion of the isolation regions 210.

In other embodiments, a method for fabricating the operating circuit 102 utilizes an EPI first/gate first method or EPI first/gate last method. In the EPI first methods, an epitaxial layer is formed on the substrate 201, and then the epitaxial layer is subsequently patterned to form the fin structures 401 and 402. Many of the operations in the EPI first embodiments are the same or similar to the operations of the STI first methods.

Subsequent processing according to embodiments of the present disclosure may also form various contacts/vias/lines and multilayer interconnect features (e.g., metal layers and interlayer dielectrics) on the semiconductor substrate 201, configured to connect the various features or structures of the operating circuit 102 and the thermoelectric device 104. For example, a multilayer interconnection includes vertical interconnects, such as conventional vias or contacts, and horizontal interconnects, such as metal lines.

Each of the thermoelectric systems 200 and 300 serves as respective examples. The thermoelectric systems 200 and 300 may be used in various applications such as digital circuits, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The present disclosure provides for the thermoelectric effect to recycle energy or cool down a circuit or system temperature by embedded thermoelectric devices in Fin FET integrated circuits. A fin structure in Fin FET technology, which owns relatively high electrical conductance but relatively low thermal conductance, exhibits desirable properties for thermoelectric devices.

Integrating the thermoelectric device in Fin FET technology provides several advantages over the traditional thermoelectric devices, such as (1) the device would require substantially no or minimum additional fabrication efforts to realize the fin structure as a thermoelectric device in Fin FET technology, (2) the device can be directly integrated with CMOS processes, (3) the device has a relatively small footprint suitable for small chip applications, (4) the device requires a low cost to produce due to the relatively small footprint, (5) thermoelectric properties of the fin structure facilitate in reducing the self-heating effects, and (6) the device can provide more electrical conductance than the traditional thermoelectric devices.

In an embodiment, a thermoelectric device includes a substrate and a first fin structure disposed on the substrate. The thermoelectric device includes a first connecting layer disposed on a first end of the first fin structure. The thermoelectric device includes a second connecting layer disposed on a second end of the first fin structure, where the first fin structure is electrically coupled to the first connecting layer and the second connecting layer. The thermoelectric device includes a first thermal conductive structure thermally coupled to the first end of the first fin structure. The thermoelectric device also includes a second thermal conductive structure thermally coupled to the second end of the first fin structure, where the first fin structure is configured to transfer heat from one of the first thermal conductive structure or the second thermal conductive structure to the other thermal conductive structure based on a direction of current flow through the first fin structure.

In another embodiment, a semiconductor device includes a substrate an active circuit formed on the substrate and including one or more Fin FETs. The semiconductor device includes a thermoelectric device formed on the substrate, where the thermoelectric device is disposed adjacent to the active circuit. The thermoelectric device is configured to transfer heat between opposing thermal conductive structures through a set of series-connected fin structures based on a direction of current flow through the set of series-connected fin structures. The semiconductor device also includes one or more power circuits electrically coupled to the thermoelectric device, where the one or more power circuits are configured to adjust the current flow for energy recycle or power generation.

In still another embodiment, a method of fabricating a thermoelectric device includes providing a substrate having a first set of fin structures corresponding to an active circuit and a second set of fin structures corresponding to a thermoelectric device, where the second set of fin structures has a first fin structure and a second fin structure. The method includes forming a first connecting layer on at least a portion of the first fin structure, where the first connecting layer is electrically coupled to the portion of the first fin structure. The method includes forming a second connecting layer on at least a portion of the second fin structure, where the second connecting layer is electrically coupled to the portion of the second fin structure. The method includes disposing a first thermal conductive structure adjacent to the first connecting layer. The method also includes disposing a second thermal conductive structure adjacent to the second connecting layer, where the second thermal conductive structure is overlapping at least a portion of the first set of fin structures. Heat from one of the first thermal conductive structure or the second thermal conductive structure being transferred through the first fin structure and the second fin structure to the other thermal conductive structure based on a direction of current flow through the first fin structure and the second fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thermoelectric system, comprising:
   a substrate;

an isolation layer disposed on the substrate;
an operating circuit that comprises one or more primary fin structures disposed on the substrate and extending above the isolation layer, a gate structure disposed on the one or more primary fin structures, a first support structure, and a first thermal conductive structure coupled to the first support structure, wherein the first thermal conductive structure is thermally coupled to the gate structure and extends directly above the operating circuit;
a thermoelectric device disposed adjacent to the operating circuit that comprises:
  first and second fin structures that each comprises only a single n-type or p-type semiconductor, wherein the first and second fin structures are of opposite semiconductor type and are disposed on the substrate and extend above the isolation layer, wherein the isolation layer surrounds the first and second fin structures and extends from the substrate up to a partial height of the first and second fin structures, wherein the single n-type or p-type semiconductor of the first and second fin structures extends from below a top surface of the isolation layer to above the top surface of the isolation layer;
  a first connecting layer disposed on a first end of the first fin structure and electrically coupled to the first end of the first fin structure;
  a second connecting layer disposed on a second end of the first fin structure and electrically coupled to the second end of the first fin structure, wherein the second end of the first fin structure is electrically coupled to a second end of the second fin structure via the second connecting layer; and
  a third connecting layer disposed on a first end of the second fin structure and electrically coupled to the first end of the second fin structure, wherein:
    the first thermal conductive structure is thermally coupled to the second end of the first fin structure and the second end of the second fin structure;
the thermoelectric system further comprising:
  a second support structure;
  a second thermal conductive structure coupled to the second support structure, wherein the second thermal conductive structure is thermally coupled to the first end of the first fin structure and the first end of the second fin structure and extends above the thermoelectric device and away from the first thermal conductive structure; and
  a first power circuit electrically coupled to the first and third connecting layers, wherein the first connecting layer is electrically coupled to a positive node of the first power circuit and the third connecting layer is electrically coupled to a negative node of the first power circuit, wherein the first and second fin structures are configured to transfer heat from the operating circuit to generate power in the first power circuit.

2. The thermoelectric system of claim 1, wherein the first fin structure is arranged in parallel to the second fin structure.

3. The thermoelectric system of claim 2, wherein the first fin structure is arranged orthogonal to the first connecting layer and the second connecting layer.

4. The thermoelectric system of claim 1, wherein:
the first fin structure has the p-type semiconductor and the second fin structure has the n-type semiconductor,
a direction of current flow through the first fin structure is from the second connecting layer to the first connecting layer from the second end to the first end of the first fin structure,
the direction of current flow through the second fin structure is from the third connecting layer to the second connecting layer from the first end to the second end of the second fin structure,
the second end of the first fin structure and the first end of the second fin structure are opposing ends that are respectively coupled between the first thermal conductive structure and the second thermal conductive structure, and
the first connecting layer and the third connecting layer are disposed in series along an axis parallel to the second connecting layer.

5. The thermoelectric system of claim 1, wherein a multilayer structure comprising a layer of high-k dielectrics is disposed over first sidewalls of the first fin structure extending above the top surface of the isolation layer, over second sidewalls of the second fin structure extending above the top surface of the isolation layer, and over the isolation layer, wherein the multilayer structure is not disposed over top surfaces at first and second ends of the first fin structure and the second fin structure.

6. The thermoelectric system of claim 1, wherein the gate structure of the operating circuit comprises a gate dielectric layer disposed on the one or more primary fin structures and a gate electrode layer disposed on the gate dielectric layer.

7. The thermoelectric system of claim 1, wherein the first thermal conductive structure is overlapping on at least a portion of the operating circuit.

8. The thermoelectric system of claim 1, wherein the first support structure comprises a conductive material and is mounted on the substrate.

9. The thermoelectric system of claim 1, wherein at least a portion of the isolation layer is formed beneath a channel region of the first fin structure to constrain heat and current in the first fin structure.

10. The thermoelectric system of claim 1, further comprising:
  a second power circuit electrically coupled to the operating circuit to supply power to the operating circuit, wherein the first power circuit is electrically coupled to the second power circuit to recycle power.

11. A semiconductor device, comprising:
a silicon-on-insulator (SOI) substrate;
an active circuit formed on the SOI substrate and comprising one or more Fin FETs, a gate structure disposed on the one or more Fin FETs, a first support structure, and a first thermal conductive structure coupled to the first support structure, wherein the first thermal conductive structure is thermally coupled to the gate structure and extends directly above the active circuit;
a thermoelectric device disposed adjacent to the active circuit and comprising:
first and second fin structures formed on the SOI substrate, wherein each fin structure comprises only a single n-type or p-type semiconductor of a same type;
a first connecting layer disposed on a first end of the first fin structure and electrically coupled to the first end of the first fin structure;
a second connecting layer disposed on a second end of the first fin structure and electrically coupled to the second end of the first fin structure, wherein the second end of the first fin structure is electrically coupled to a first end of the second fin structure via the second connecting layer; and
a third connecting layer disposed to a second end of the second fin structure and electrically coupled to the second end of the second fin structure, wherein the first fin structure, the second connecting layer, and the second fin structure form a zig-zag on the SOI substrate;
the first thermal conductive structure is thermally coupled to the second end of the first fin structure and the second end of the second fin structure;
a second support structure and a second thermal conductive structure coupled to the second support structure, wherein the second thermal conductive structure is thermally coupled to the first end of the first fin structure and the first end of the second fin structure and extends above the thermoelectric device and away from the first thermal conductive structure;
and first and second power circuits electrically coupled to respective the thermoelectric device and the active circuit, wherein the first power circuit is electrically coupled to the first and third connecting layers, wherein the first connecting layer is electrically coupled to a positive node of the first power circuit and the third connecting layer is electrically coupled to a negative node of the first power circuit, and wherein the first and second fin structures are configured to transfer heat from the active circuit to generate power in the first power circuit.

12. The semiconductor device of claim 11, wherein: the second power circuit is electrically coupled to the active circuit to supply power to the active circuit, wherein the first power circuit is electrically coupled to the second power circuit to recycle power.

13. The semiconductor device of claim 11, wherein: a direction of current flow through the first fin structure is from the second connecting layer to the first connecting layer from the second end to the first end of the first fin structure,
the direction of current flow through the second fin structure is from the third connecting layer to the second connecting layer from the second end to the first end of the second fin structure,
the second end of the first fin structure and the first end of the second fin structure are opposing ends that are respectively coupled between the first thermal conductive structure and the second thermal conductive structure, and
the first connecting layer and the third connecting layer are disposed in parallel.

14. The semiconductor device of claim 11, wherein the second thermal conductive structure is arranged above the thermoelectric device.

15. The semiconductor device of claim 11, wherein a width of the first and second fin structures is arranged about 7 nm.

16. A thermoelectric system, comprising:
a SiGe substrate;
an isolation layer disposed on the SiGe substrate;
a thermoelectric device that comprises:
at least one first fin structure that comprises only a single n-type or p-type semiconductor disposed along a first direction on the SiGe substrate and extend above the isolation layer, wherein the isolation layer surrounds the first fin structure and extends from the SiGe substrate up to a partial height of the first fin structure,
wherein the single n-type or p-type semiconductor of the first fin structure extends from below a top surface of the isolation layer to above the top surface of the isolation layer, and wherein the first fin structure has a first end and a second end opposite to the first end along the first direction;
at least one second fin structure that comprises a single n-type or p-type semiconductor same as a semiconductor type of the first fin structure disposed along the first direction on the SiGe substrate and spaced apart from the first fin structure,
wherein the single n-type or p-type semiconductor of the second fin structure extends from below the top surface of the isolation layer to above the top surface of the isolation layer, and the second fin structure has a first end and a second end opposite to the first end along the first direction, and
the second fin structure is arranged parallel to the first fin structure and spaced alongside the first fin structure in a second direction;
a first connecting layer disposed on the first end of the first fin structure;
a second connecting layer disposed on the second end of the first fin structure and the first end of the second fin structure, thereby electrically coupling the second end of the first fin structure and the first end of the second fin structure;
a third connecting layer disposed on the second end of the second fin structure;
a first thermal conductive structure thermally coupled to the second end of the first fin structure and the second end of the second fin structure; and
a second thermal conductive structure thermally coupled to the first end of the first fin structure and the first end of the second fin structure, wherein the thermoelectric device is configured to transfer heat from the first thermal conductive structure to the second thermal conductive structure.

17. The thermoelectric system of claim 16, wherein at least a portion of the isolation layer is formed beneath a channel region of each of the first and second fin structures to constrain heat and current in the first and second fin structures.

18. The thermoelectric system of claim 16, wherein:
the first fin structure and the second fin structure are disposed in parallel with a first slanted angle,
the first connecting layer, the second connecting layer, and the third connecting layer are disposed in parallel with a second slanted angle different from the first slanted angle, and
a combination of the first and second fin structures connected together by the first, the second, and the third connecting layers are arranged to make a zig-zag daisy chain.

19. The thermoelectric system of claim 16, further comprising:
an operating circuit that comprises one or more Fin FETs disposed on the SiGe substrate and extending above the isolation layer, a gate structure disposed on the one or more Fin FETs, and a first support structure, wherein the first thermal conductive structure is thermally coupled to the gate structure and extends directly above the operating circuit, wherein:
the second thermal conductive structure is coupled to a second support structure and extends above the thermoelectric device and away from the first thermal conductive structure; and a first power circuit electrically coupled to the thermoelectric device via the first and third connecting layers, wherein the first connecting layer is electrically coupled to a positive node of the first power circuit and the third connecting layer is electrically coupled to a negative node of the first power circuit, wherein:

the first fin structure has the p-type semiconductor and the second fin structure has the n-type semiconductor; and the first and second fin structures are configured to transfer heat from the operating circuit to generate power in the first power circuit.

20. The thermoelectric system of claim 19, further comprising:

a power transmission line and a second power circuit electrically coupled to the operating circuit, wherein the first power circuit is electrically coupled to the second power circuit via the power transmission line to recycle power.

* * * * *